(12) United States Patent
Akaogi

(10) Patent No.: US 6,246,609 B1
(45) Date of Patent: Jun. 12, 2001

(54) DECODER CIRCUIT

(75) Inventor: Takao Akaogi, Cupertino, CA (US)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/365,071

(22) Filed: Jul. 30, 1999

Related U.S. Application Data

(60) Provisional application No. 60/146,424, filed on Jul. 29, 1999.

(51) Int. Cl.$^7$ .................................................. G11C 11/34
(52) U.S. Cl. .................................. 365/185.23; 365/185.11
(58) Field of Search ........................... 365/185.11, 185.23

(56) References Cited

U.S. PATENT DOCUMENTS 5,910,913 * 6/1999 Kato et al. ...................... 365/185.11

* cited by examiner

Primary Examiner—David Nelms
Assistant Examiner—M. Tran
(74) Attorney, Agent, or Firm—Christie, Parker & Hale, LLP

(57) ABSTRACT

A decoder circuit has two separate portions, a low voltage portion and a high voltage portion. Through the use of the high voltage portion, the decoder circuit is capable of supplying high program voltage. Through the use of low voltage portion and isolated from the high voltage portion, quick read operation is performed.

7 Claims, 16 Drawing Sheets

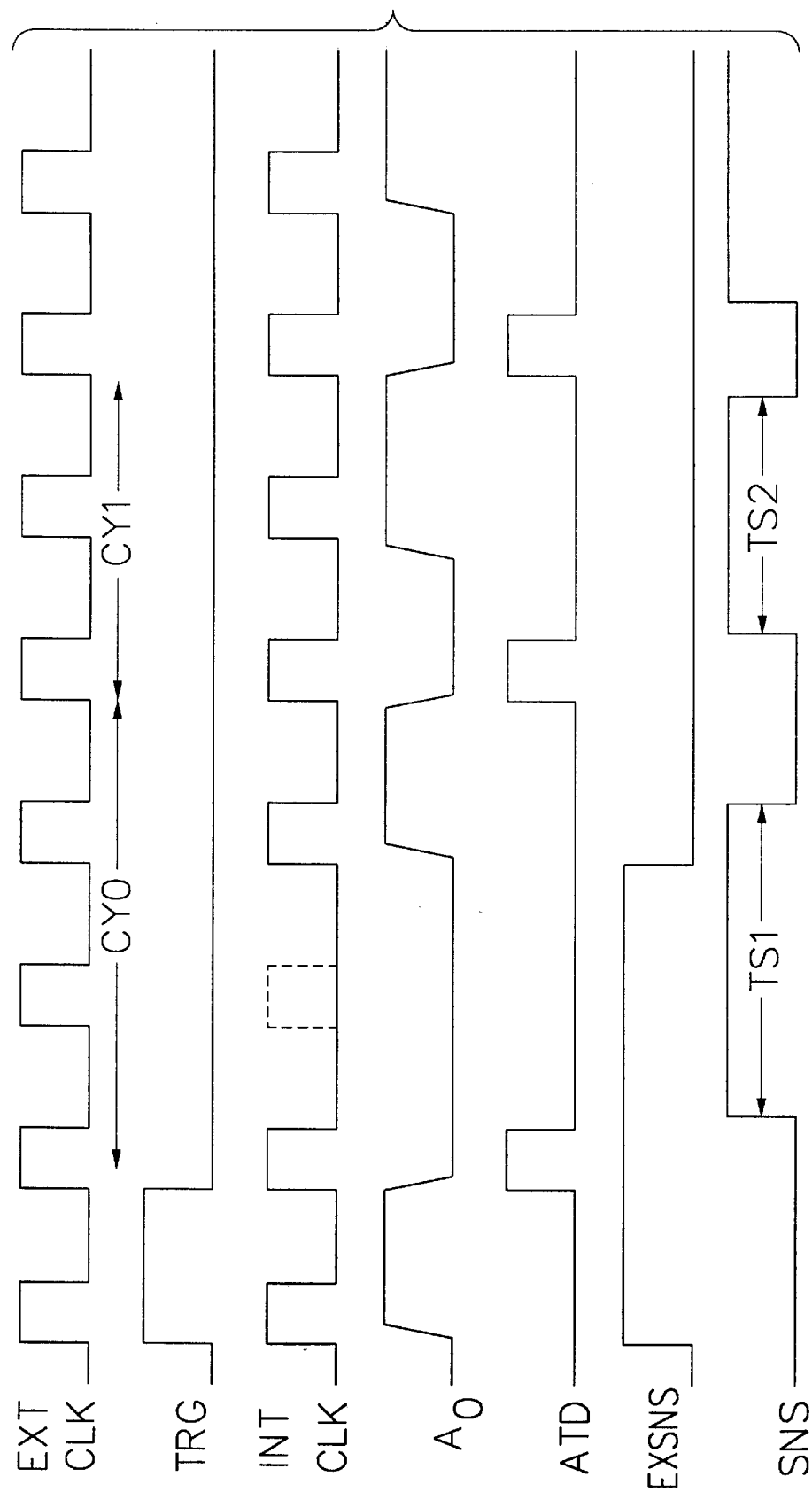

DECODER CIRCUIT

CROSS-REFERENCE TO RELATED APPLICATION(S)

This application claims the benefit of U.S. Provisional Application No. 60/146,424 entitled Clock Control Circuit and Decoder Circuit and High Voltage Comparator, filed Jul. 29, 1999 which is hereby incorporated by reference as if set forth in full herein.

BACKGROUND OF THE INVENTION

This invention relates generally to semiconductor devices, and more particularly to a decoder circuit for semiconductor devices, especially non-volatile semiconductor memory devices such as flash memory devices.

Generally, a flash memory device comprises an address sequencer, row and column decoders, sense amplifiers, write amplifiers, and a memory cell array. An example of a flash memory device is described in U.S. Pat. No. 5,490,107, the disclosure of which is herein incorporated by reference. The memory cell array contains a plurality of memory cells arranged in rows and columns. Each memory cell is capable of holding a single bit of information. A column of memory cells in the memory cell array is commonly coupled to a bit line. The column decoder along with the address sequencer selects a bit line. Similarly, the memory cells arranged in a row of the memory cell array are commonly coupled to a word line. The row decoder and address sequencer selects a word line. Together the row and column decoders and the address sequencer selects an individual memory cell or a group of memory cells.

The memory cells in the memory cell array of a flash memory device are generally grouped into sub-arrays called memory cell blocks. Each memory cell block is coupled to a sense amplifier and a write amplifier. The write amplifier (W/A) applies a set of predetermined voltages to store information in the selected memory cells. This action is referred to as a program or write operation. Similarly, a set of predetermined voltages applied to the selected memory cells allows information to be discriminated and retrieved by the sense amplifier (S/A). This action is referred to as a read operation.

During a write or program operation, relatively high program voltage $V_{pp}$ needs to be supplied by the decoder circuits to the memory cells. Since the decoder circuits must handle $V_{pp}$, high voltage transistors must be used in the decoder circuits. However, high voltage transistors have a thick oxide layer and thus operate slower than lower voltage transistors.

Therefore, in order to increase the speed of program and read operations, it would be advantageous to use lower voltage transistors. Since high voltage transistors are necessary in the decoder circuit to handle $V_{pp}$, it would be beneficial to separate the high voltage portion of the decoder circuit from the lower voltage portion. If most of the logical switching is handled by the low voltage portion in the decoder circuits, the flash memory device with an increased capability for faster read and program operation would result.

SUMMARY OF THE INVENTION

The present invention provides a decoder circuit. The decoder circuit comprises a gate voltage provider circuit and a gate voltage selection circuit. The gate voltage provider circuit receives a plurality of address signals and a gate voltage and provides the gate voltage as an output. Also, the gate voltage provider circuit provides the gate voltage output when the address signals indicate conditions are met for generating the gate voltage output. The gate voltage selection circuit provides the gate voltage to the gate voltage provider circuit for use as the output of the gate voltage provider circuit.

Many of the attendant features of this invention will be more readily appreciated as the same becomes better understood by reference to the following detailed description and considered in connection with the accompanying drawings in which like reference symbols designate like parts throughout.

DESCRIPTION OF THE DRAWINGS

FIG. 10 is a timing diagram illustrating the interaction between different signals using the data timing circuit of FIG. 8;

DETAILED DESCRIPTION OF THE INVENTION

I. Overview

Figure 1:
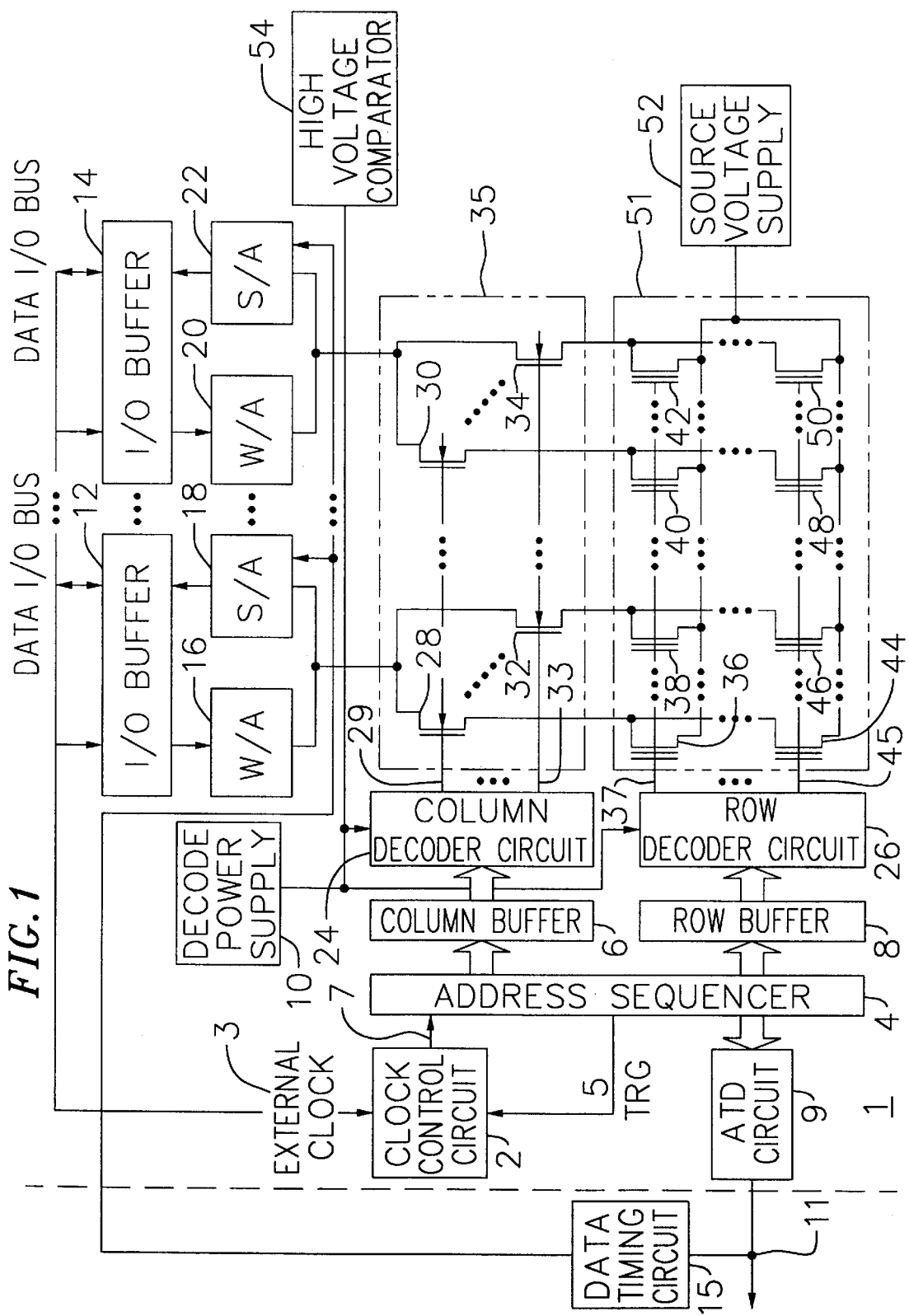
FIG. 1 is an top level block diagram of a flash memory device of the present invention.

In FIG. 1, one embodiment of a synchronous flash memory is shown. The synchronous flash memory has a clock control circuit 2. The clock control circuit 2 receives an external clock signal 3, and combines the external clock signal with a trigger signal to generate an internal clock signal 7. An address sequencer 4 receives the internal clock signal 7 and sequences through addresses and generates address signals synchronously to the internal clock signal 7. The address signals are provided to column and row buffers 6 and 8. The address signals are selectively modified and supplied to column and row decoder circuits 24 and 26. The column and row decoder circuits generate column and row decoded signals to select specific memory cells in the memory cell array 51 for read and program operations.

Each memory cell has a construction similar to a MOS transistor, and as such, a memory cell has a source region and a drain region on a substrate. Between the substrate, the memory cell has a floating gate and a control gate. Information is stored in the memory cell, i.e. in the floating gate, by applying a set of predetermined voltages to the memory cell. Likewise, a set of predetermined voltages applied to the memory cell is used to read information contained in the memory cell. The memory cell array 51 contains a plurality of memory cells 36, 38, 40, 42, 44, 46, 48 and 50. For clarity, only a subset of the memory cells in the memory cell array 51 is shown. The memory cells 36, 38, 44 and 46 are grouped into a first memory cell block and the memory cells 40, 42, 48 and 50 are grouped into a second memory cell block. Each memory cell block is coupled to a corresponding write amplifier and sense amplifier pair through corresponding control transistors. Specifically, the drains of the control transistors are coupled to a write amplifier and a sense amplifier. For instance, drain of the first column control transistors 28 of the first memory cell block is coupled to write amplifier 16 and sense amplifier 18.

Similarly, drains of the memory cells are coupled to control transistors. For instance, drains of the memory cells 36 and 44 are coupled to a source of a first column control transistor 28. The gates of the control transistors are coupled to the column decoder circuit 24 through decoded signal lines. For instance, gates of first and third column control transistors 28 and 30 are coupled to a first column decoded signal line 29 from the column decoder circuit 24.

Each write amplifier and sense amplifier pair is also coupled to a corresponding input/output buffer. In FIG. 1, the write amplifier 16 and the sense amplifier 18 are coupled to input/output buffer 12 and write amplifier 20 and sense amplifier 22 are coupled to input/output buffer 14.

The input/output buffers 12 and 14 are further coupled to the external clock signal 3 and a data input/output bus 1. Prior to a program operation, program data coming over a data input/output bus are stored in corresponding input/output buffers, synchronously to the external clock signal 3. The program operation then executes synchronously to the internal clock signal 7 generated by the clock control circuit 2. During a read operation, detected or sensed data are stored in corresponding input/output buffers, synchronously to the internal clock signal 7, and then transferred out over the data input/output bus 1, synchronously to the external clock signal 3. Input and output transfers to and from the input/output buffers are capable of being executed simultaneously. These synchronous transfers allows the speed for both a read and program operation to be maximized. However, each read and program operation depends on the internal clock signal 7 generated by the clock control circuit 2.

II. Clock Control Circuit

As previously described in reference to FIG. 1, predetermined voltage levels must be applied to the appropriate memory cells to perform a read operation. These read voltages are applied over the word and bit lines. These word and bit lines inherently have built in delays due to resistance and capacitance on a given line. During a read operation, when there is a transition from the last set of memory cells on a word line to the next set of memory cells on a next word line, i.e. a boundary crossing or word line switch, these delays are increased. Since the operating read voltage levels must be removed from one word line and applied to another word line, a read operation for a word line switch often takes twice as long as a read operation from one memory cell to another memory cell in the same word line. In other words, data sensing may take longer than one clock period of the external clock signal 3.

Figure 2:
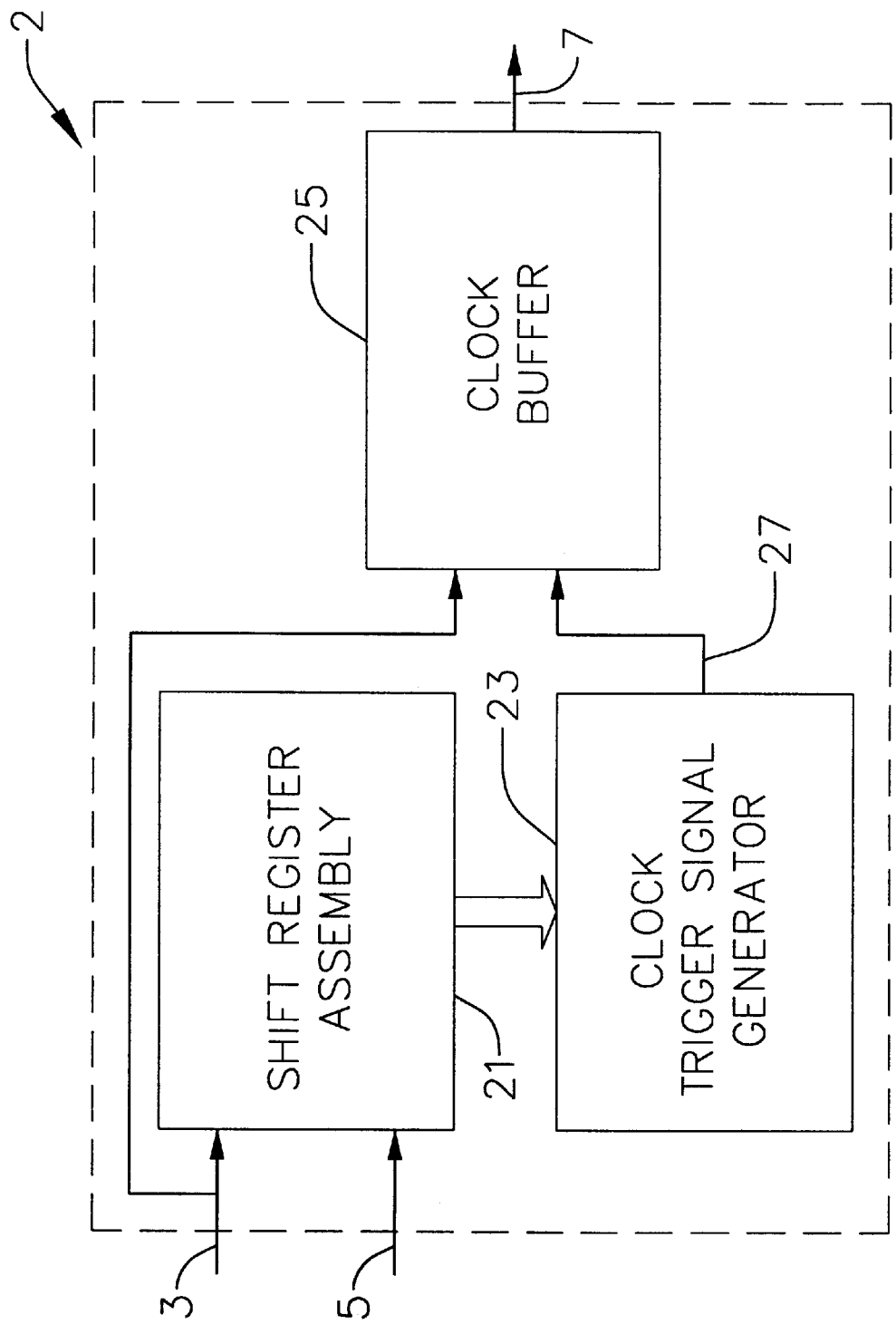
FIG. 2 is a top level block diagram of one embodiment of a clock control circuit.

To provide additional time for data sensing, an internal clock signal 7 is generated by the clock control circuit 2 of FIG. 2. The internal clock signal 7 is synchronized to the external clock signal, but contains one or more clock cycles blocked out. By supplying the internal clock signal 7 to the address sequencer, data being clocked out to the data I/O bus is delayed as necessary to allow for more time for data sensing.

The clock control circuit 2 contains a shift register assembly 100, a clock trigger signal generator 23 and a clock buffer 25. With the inputs of the external clock signal 3 and the trigger signal 5, the clock control circuit 2 produces the internal clock signal 7. The shift register assembly 100 uses the external clock signal 3 to supply delayed trigger signals to the clock trigger signal generator 23. With the inputs of the external clock signal 3 and a clock trigger signal 27 generated from the clock trigger signal generator 23, the clock buffer produces the internal clock signal 7.

Figure 3:
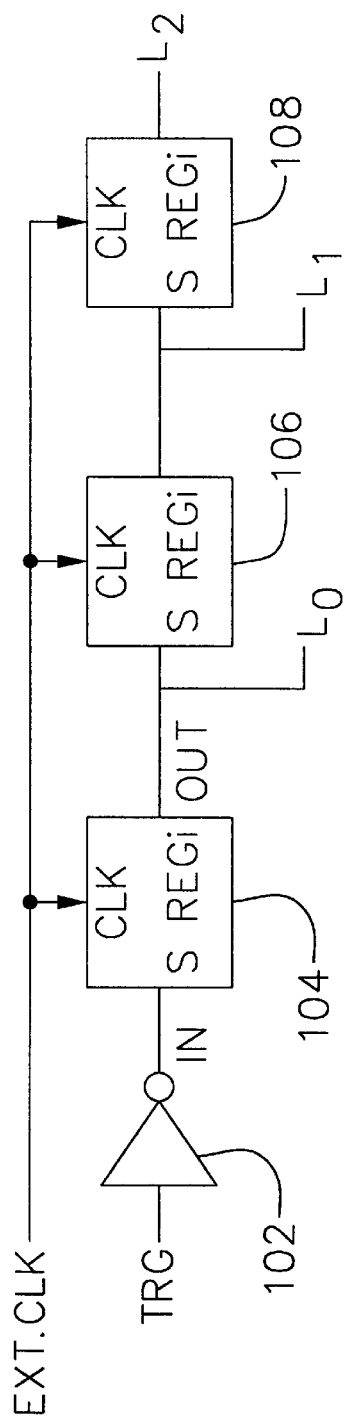
FIG. 3 is a block diagram of one embodiment of the shift register assembly of the clock control circuit of FIG. 2.

FIG. 3 illustrates one embodiment of the shift register assembly 100. The trigger signal 5 is generated from the address sequencer shown in FIG. 1. The address sequencer 4 generates the trigger signal 5 upon each increment of an address. The trigger signal 5 is coupled to an input of an inverter 102. An output of the inverter 102 is coupled to an input of a first shift register 104. An output, the first time delayed trigger signal $L_0$, of the first shift register 104 is coupled to an input of a second shift register 106. An output, the second time delayed trigger signal $L_1$, of the second shift register 106 is coupled to an input of a third shift register 108. The third shift register 108 generates a third time delayed trigger signal $L_2$ as an output. Each of the shift registers 104, 106 and 108 are coupled to the external clock 3. Although FIG. 3 shows only three shift registers in the shift register assembly 100, the number of shift registers used is flexible, and depends on the number of external clock cycles to be blocked out from the internal clock signal 7.

Figure 4:
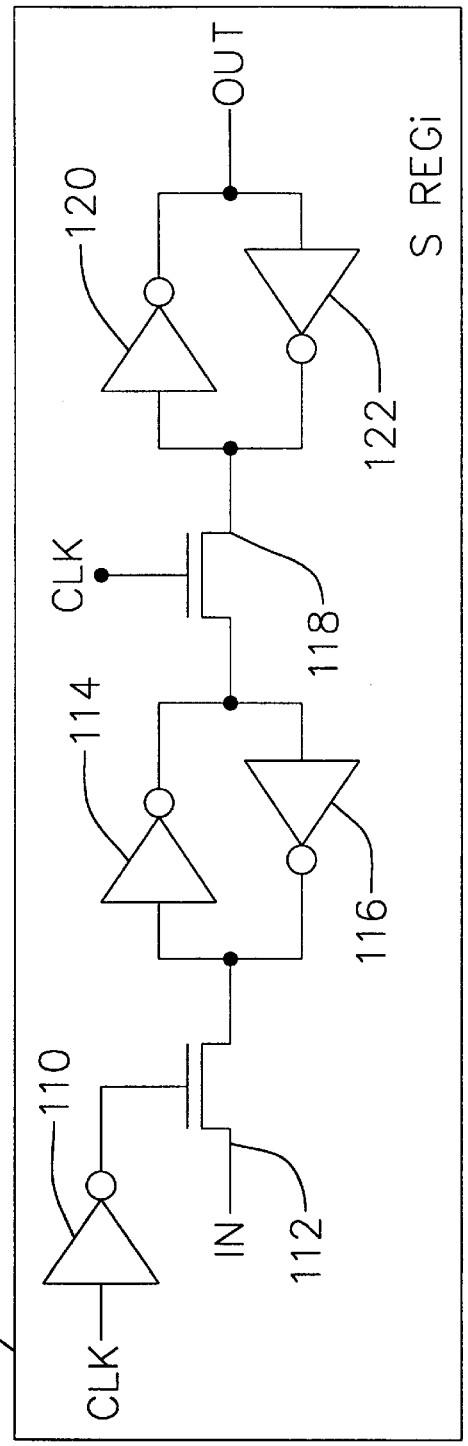
FIG. 4 is a schematic of one of the shift registers in the shift register assembly of FIG. 3.

In FIG. 4, one embodiment of the shift registers 104, 106, 108 in the shift register assembly 100 of FIG. 3 is shown.

The external clock signal 3 is coupled to an input of an inverter 110. An output of the inverter 110 is coupled to a gate of a transistor 112. A drain of the transistor 112 is coupled to the input of the shift register 104. A source of the transistor 112 is coupled to an input of an inverter 114 and an output of an inverter 116. The inverters 114 and 116 comprise a first latch. This first latch stores the input of the shift register synchronously to a falling edge of the external clock signal 3.

An output of the inverter 114 and an input of the inverter 116 are coupled to a drain of a transistor 118. A gate of the transistor 118 is coupled to the external clock signal 3. A source of the transistor 118 is coupled to an input of an inverter 120 and an output of an inverter 122. The inverters 120 and 122 comprise a second latch. This second latch stores the content of the first latch synchronously to a rising edge of the external clock signal 3. An output of the inverter 120 and an input of the inverter 122 are coupled together and provide the output of the shift register, a time delayed trigger signal.

The clock trigger signal generating circuit 130 receives the time delayed trigger signals $L_0$, $L_1$, and $L_2$ produced from the shift register assembly 100. The clock trigger signal generating circuit 130 in FIG. 5 contains in parallel a first, second and third two-input NOR gates 132, 134 and 136. The first time delayed trigger signal $L_0$ is coupled to a first input of the first two-input NOR gate 132. The second time delayed trigger signal $L_1$ is coupled to a first input of the second two-input NOR gate 134 and the third time delayed trigger signal $L_2$ is coupled to a first input of the third two-input NOR gate 136.

Second inputs of the two-input NOR gates 132, 134 and 136 are coupled to the clock block signals B1, B2 and B3, respectively. Although clock block signals B1, B2 and B3 are typically set prior to fabrication of the synchronous flash memory device, the clock block signals are capable of being set during the operation of the synchronous flash memory device. The clock block signals B1, B2 and B3 determine the number of external clock cycles to be blocked out of the internal clock signal 7.

For example, if the first clock block signal B1 is set low and the second and third clock block signals B2 and B3 are set high, one external clock cycle is blocked out from the internal clock signal 7. If the first and second clock block signals B1 and B2 are set low with the third clock block signal B3 set high, two external clock cycles are blocked out from the internal clock signal 7.

Figure 5:
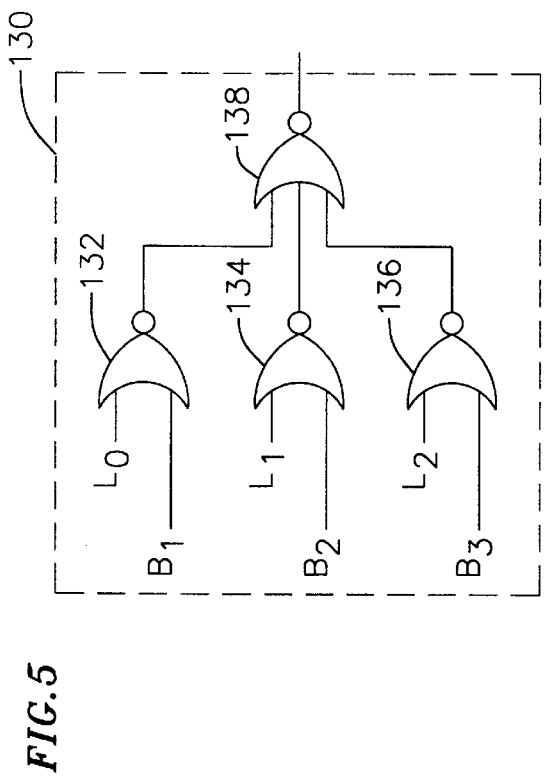
FIG. 5 is a schematic of one embodiment of the trigger signal generating circuit of FIG. 2.

Although FIG. 5 shows three two-input NOR-gates in the clock trigger signal generating circuit 130, the number of two-input NOR-gates used depends only on the number of clock cycles to be blocked out from the internal clock signal 7.

The clock trigger signal generating circuit 130 also comprises a three-input NOR gate 138. Outputs of the three two-input NOR gates are coupled to inputs of the three-input NOR gate 138. An output of the three-input NOR gate 138 is the output of the clock trigger signal generating circuit and is coupled to an input of a clock buffer 140 in FIG. 2. The output of each of the two-input NOR gates 132, 134 and 136 goes high when both the corresponding clock block signal and the corresponding time delayed trigger signal are low. When one or more of the outputs of the two-input NOR gates goes high, the output of the three-input NOR gate 138 goes low. This output of the three-input NOR gate 138 is the clock trigger signal used to block out one or more of the external clock signals when combined with the external clock signal 3 in the clock buffer 140.

Figure 6:
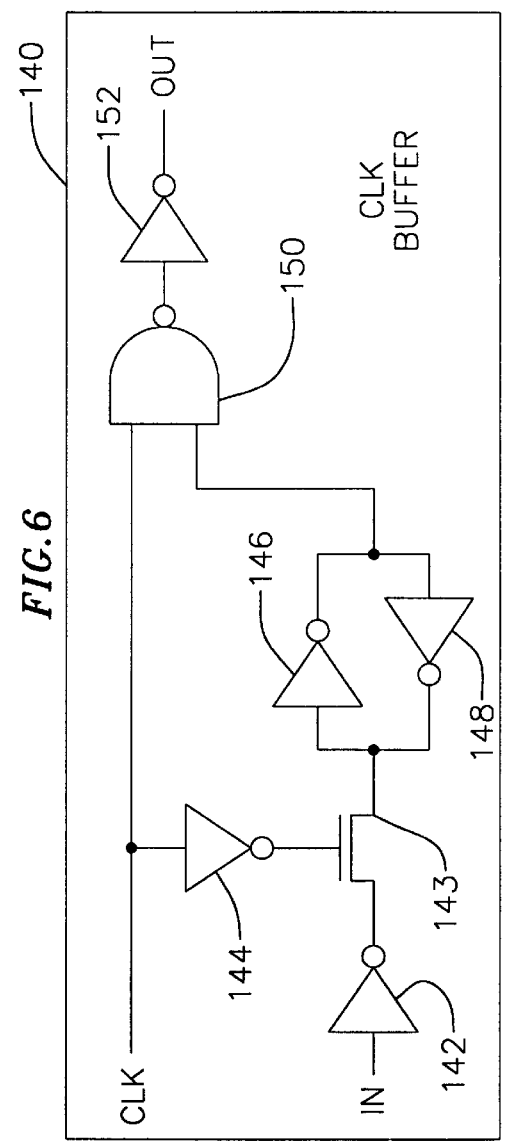
FIG. 6 is a schematic of one embodiment of the clock buffer of FIG. 2.

In FIG. 6, the clock buffer 140 of FIG. 2 is shown. The clock buffer input, the output of the clock trigger signal generating circuit in FIG. 5, is coupled to an input of an inverter 142. An output of the inverter 142 is coupled to a drain of a transistor 143. A source of the transistor 143 is coupled to an input of an inverter 146 and an output of an inverter 148. The inverters 146 and 148 comprise a latch.

The external clock signal 3 is coupled to an input of an inverter 144 and a first input of a two-input NAND gate 150. An output of the inverter 144 is coupled to a gate of the transistor 143. An output of the inverter 146 and an input of the inverter 148 are coupled to a second input of the two-input NAND gate 150. An output of the two-input NAND gate 150 is coupled to an input of an inverter 152.

The input of the inverter 142, the clock trigger signal, contains information of how many external clock cycles are to be block out during the generation of the internal clock signal 7. The output of the inverter 142 is the internal clock signal 7 from which one or more of the external clock cycles are blocked out.

Figure 7:
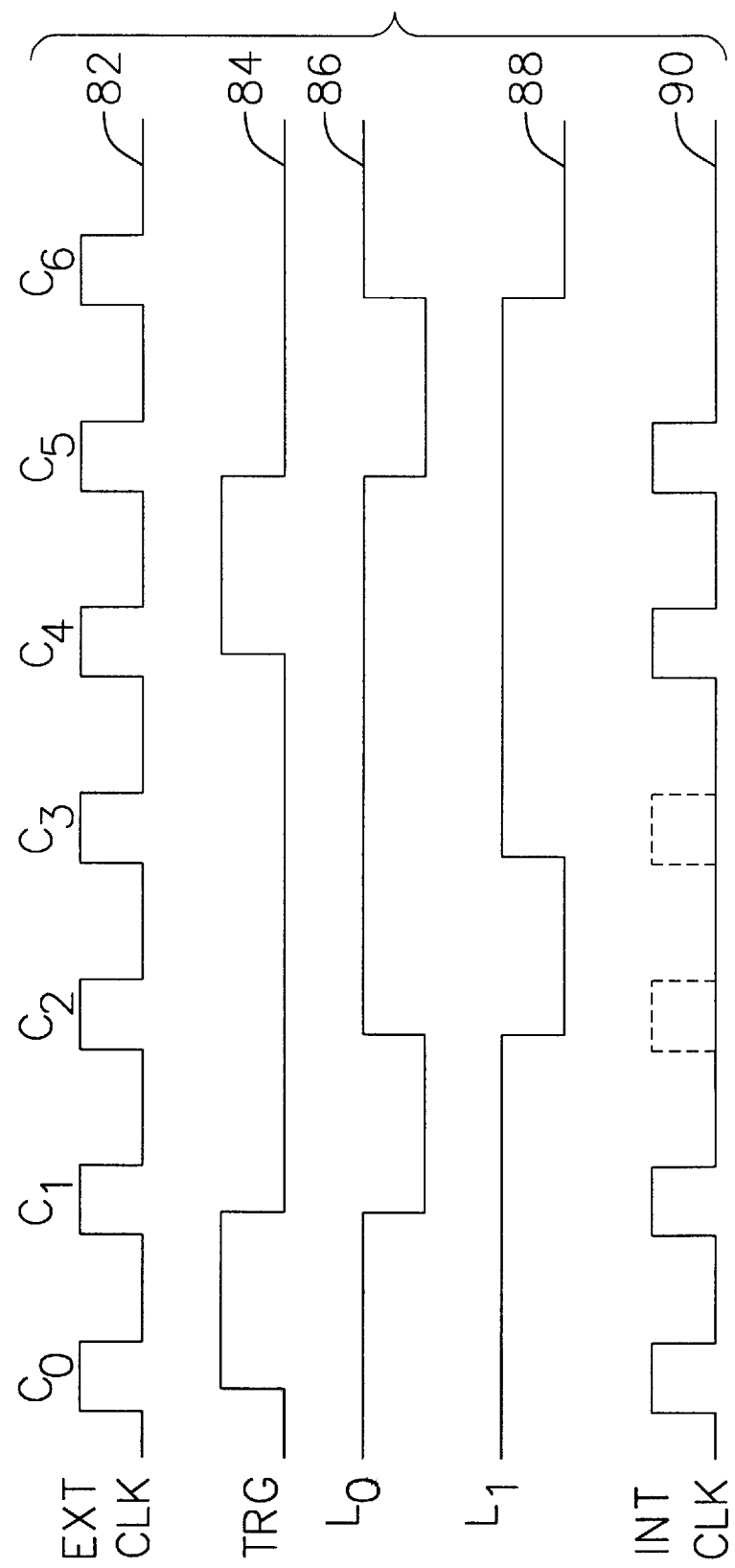
FIG. 7 is a timing diagram illustrating relationships between different signals using the clock control circuit of FIG. 2.

FIG. 7 is a timing diagram that summarizes the operation of the clock control circuit 2 of FIGS. 2–6. An external clock signal timing diagram 82, a trigger signal timing diagram 84, a first time delayed trigger signal 86, a second time delayed trigger signal 88 and an internal clock signal timing diagram 90 are shown.

As seen from the timing diagrams, when the trigger signal goes high, a first time delayed trigger signal $L_0$ goes low at a rising edge of the external clock signal 3. When the first time delayed trigger signal $L_0$ is low, a second time delayed trigger signal $L_1$ goes low with the rising edge of the external clock signal 3. When both time delayed signals $L_0$ and $L_1$ are implemented using clock block signals B1 and B2, two adjacent clock cycles are blocked out from the internal clock signal 7 with respect to the external clock signal 3. Hence, as illustrated in FIG. 7, the internal clock signal resembles or is synchronized to the external clock signal. However, the internal clock signal 7 contains a two missing clock cycles. By removing clock cycles, additional time is provided for read or data sensing operations.

II(a). Data Timing Control Circuit

Figure 8:
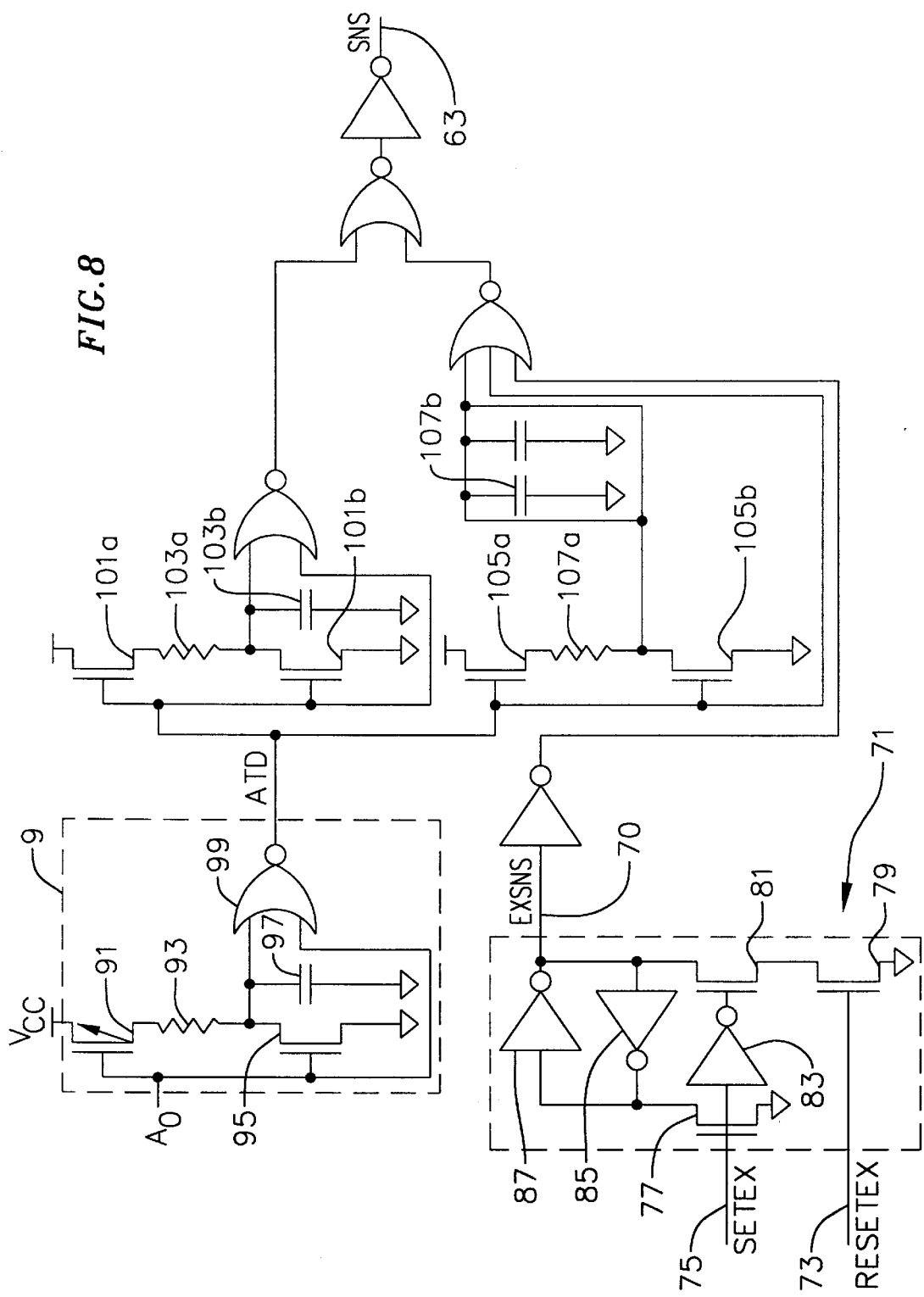
FIG. 8 is a schematic of one embodiment of the data timing circuit of FIG. 1.

The internal clock signal 7 provides additional time, i.e. more clock cycles in reference to the external clock signal, to the sense amplifiers for data sensing, i.e. read data from the memory cells through the use of a data timing control circuit. FIG. 8 illustrates a data timing control circuit 15 that generates a data sense signal 63. The data timing control circuit 15 is coupled to an extended data circuit 71 and an ATD circuit 9. The ATD circuit 9 is supplied an $A_0$ signal, the least significant bit of the address signals from the address sequencer. The address sequencer generates a pulse, the $A_0$ signal, upon each address increment.

The ATD circuit 9 has a p-channel transistor 91 and a n-channel transistor 95. Connected to the drain of the p-channel transistor 91 is a reference voltage $V_{cc}$ and connected to a source of the p-channel transistor 91 is a resistor 93. Connected to the other end of the resistor 93 is the drain of the n-channel transistor 91, one end of a capacitor 97 and a first input to a two-input NOR gate 99. The $A_0$ signal is supplied to gates of both, the p-channel transistor 91 and the n-channel transistor 95. These two transistor together act as an inverter to invert the $A_0$ signal. For instance, if the $A_0$ signal is high, the p-channel transistor 91 turns off and the n-channel transistor turns on, thus creating a path to ground. Hence, the first input of the NOR gate 99 connected to the n-channel transistor 99 is pulled to ground, i.e. low. Conversely, if the $A_0$ signal is low, the p-channel transistor 91 turns on and the n-channel transistor turns off, thus creating a path to $V_{cc}$. Hence, the first input of the NOR gate 99 connected to the n-channel transistor 99 is gradually pulled to $V_{cc}$, i.e. high.

A second input to the NOR gate 99 is coupled to the $A_0$ signal. At each transition from low to high of the $A_0$ signal, the output of the NOR gate 99, the ATD signal, is low as the first input of the NOR gate 99 is pulled to ground. Upon the transition from high to low of the $A_0$ signal, the first input of the NOR gate 99 is gradually pulled to high. During this gradual transition of the first input of the NOR gate 99 from low to high, both inputs to the NOR gate 99 are low. Therefore, the output of the NOR gate 99 goes from high to low and thus produces a rising edge for the ATD signal. The ATD signal remains high until the first input of the NOR gate 99 makes the transition and becomes high. Once the first input of the NOR gate 99 becomes high, the ATD signal goes low and thus a falling edge of the ATD signal is produced. The resistor 93 and the capacitor 97 determines a time constant which determines the time period or pulse width of the ATD signal produced. The ATD signal provides one input to the date timing control circuit 15. The other input to the data timing control circuit 15 is an extended data sense (EXSNS) signal 70.

The EXSNS signal 70 is generated by the extended data circuit 71. The logic state of EXSNS signal 70 depends on the inputs to the extended data circuit 71, an extended reset data sense (RESETEX) signal 73 and an extended set data sense (SETEX) signal 75. A set data sense buffer, illustrated in FIG. 9a, generates the SETEX signal 73 and a reset data sense buffer, illustrated in FIG. 9b, generates the RESETEX signal 75. The set data sense buffer and the reset data sense buffer are identical except for the inputs to each of the buffers. The set data sense buffer is supplied as inputs, the internal clock signal and the trigger (TRG) signal. The reset data sense buffer, on the other hand, has the internal clock signal and the $A_0$ signal as inputs.

Figure 9A:
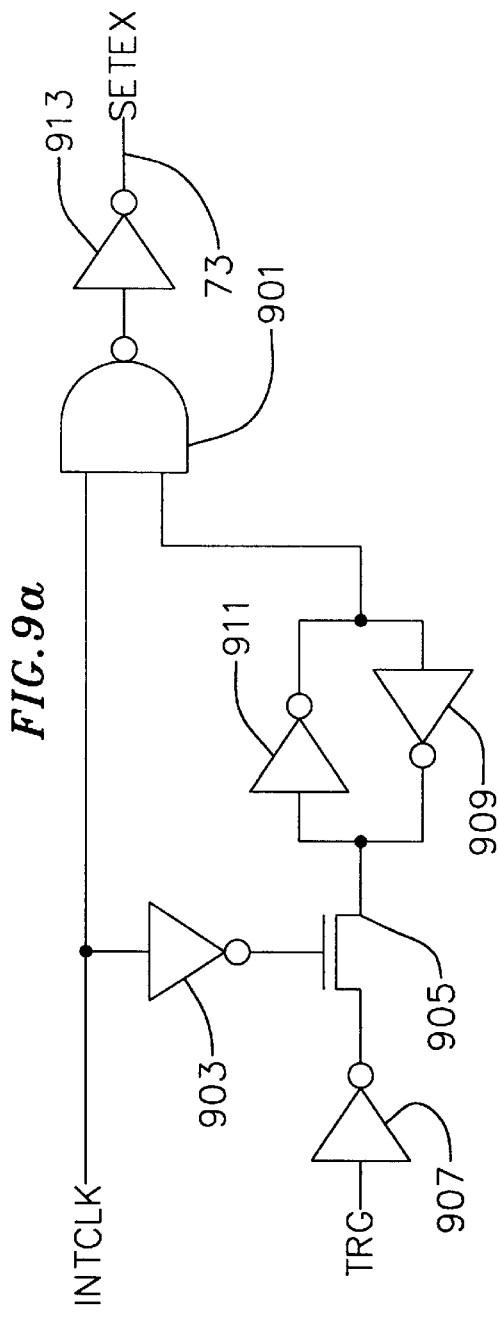
FIG. 9(a) is a schematic of one embodiment of a set extended sense buffer circuit.

In FIG. 9a, the internal clock (INTCLK) signal is connected to a first input of a NAND gate 901 and an input of an inverter 903. The inverter 903 is connected to a gate of the transistor switch 905. As the INTCLK signal goes low, the transistor switch 905 turns on. When the transistor switch 905 is on, output of an inverter 907 connected to a drain of the transistor switch 905 is passed to the inverters 909 and 911 through a source of the transistor switch 905. Input to the inverter 907 is connected to the TRG signal. The inverters 909 and 911 invert the signal from the source of the transistor switch 905 and supply this signal to a second input of the NAND gate 901. The inverters 909 and 911 also act as a latch to maintain the logic state at the second input of the NAND gate 901, which is basically, the TRG signal. Output of the NAND gate 901 is coupled to an input of an inverter 913. Output of the inverter 913 is the SETEX signal 73. With the INTCLK signal low and the output of the NAND gate 901 high, the SETEX signal 73 is low.

As the INTCLK signal goes high, the transistor switch 905 turns off and the first input of the NAND gate 901 is also high. Therefore, when the INTCLK signal goes high, the signal at the second input of the NAND gate 901 which is basically the TRG signal is "clocked" through to set the logic state of the SETEX signal 73. Therefore, if the TRG signal was low prior to the INTCLK signal going high, the SETEX signal is also low. However, if the TRG signal was high prior to the INTCLK signal going high, the SETEX signal goes high. Therefore, the SETEX signal goes high at the rising edge of the INTCLK and when the TRG signal is high and the SETEX signal goes low at the falling edge of the INTCLK and when the TRG signal goes low.

Figure 9B:
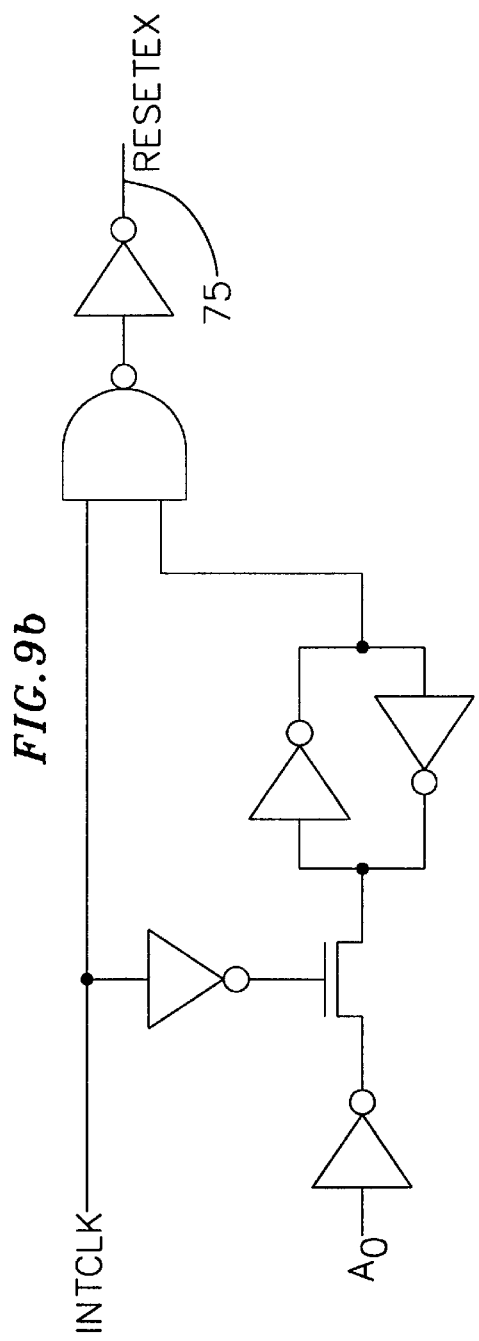
FIG. 9(b) is a schematic of one embodiment of a reset extended sense buffer circuit.

As previously mentioned, the reset data sense buffer in FIG. 9b is similar to the set data sense buffer in FIG. 9a, described above, except for the inputs to the buffers. Therefore, the RESETEX signal 75 is generated in the same fashion as the SETEX signal. However, the $A_0$ signal effects the logic state of the RESETEX signal 75. Therefore, as the INTCLK signal goes high, the $A_0$ signal is "clocked" through to set the logic state of the RESETEX signal 75. If the $A_0$ signal is low prior to the INTCLK signal going high, the RESETEX signal is also low. However, if the $A_0$ signal is high prior to the INTCLK signal going high, the RESETEX signal goes high. Therefore, the RESETEX signal goes high at the rising edge of the INTCLK and when the $A_0$ signal is high and the RESETEX signal goes low at the falling edge of the INTCLK and when the $A_0$ signal goes low.

Referring back to FIG. 8, the RESETEX signal 75 and the SETEX signal 73 are supplied as inputs to the extended data circuit 71. The SETEX signal 73 is coupled to a gate of a first transistor 77 and an input of an inverter 83. An output of the inverter 83 is coupled to the gate of a second transistor 81. When the SETEX signal goes high, the first transistor 77 turns on and the second transistor 81 turns off, due to the intervening inverter 83. A source of the first transistor 77 is coupled to ground and a drain of the first transistor 77 is coupled to inverters 85 and 87. The EXSNS signal 70 is an output of the inverter 87. The inverters 85 and 87 act as a latch and maintain the logic state at the drain of the first transistor 77. Therefore, as the first transistor turns on, a path to ground is developed and the EXSNS signal 70 goes high.

Conversely, as the SETEX signal goes low, the first transistor 77 turns off and the second transistor 81 turns on. The RESETEX signal 73 is coupled to a gate of a third transistor 79. This third transistor 79 has a source that is coupled to ground and a drain that is coupled to a source of the second transistor 81. A drain of the second transistor is coupled to the inverters 85 and 87 and also acts as a second source to supply the EXSNS signal 70. With the SETEX signal 75 low, if the RESETEX signal 73 goes high, then a path to ground is developed. Therefore, the EXSNS signal 70 is pulled to ground and goes low.

The EXSNS signal 70 is supplied to the data timing control circuit 15 and is combined with the ATD signal from the ATD circuit 9 to produce the data sense signal 63. In FIG. 8, the transistors in the data timing control circuit 15 operate in a similar fashion as the transistors of the ATD circuit 9, previously described. Therefore, the transistors 101a and 101b and the transistors 105a and 105b receiving the ATD signal act as inverters. The resistors 103a and 107a along with the capacitors 103b, 107b, and 107c, also operate similarly to the resistor 93 and capacitor 97 of the ATD circuit 9, i.e. producing a RC delay or time constant. However, with the addition of the capacitor 107c, the delay experienced at inputs of NOR gate 109b is longer than the delay experienced at inputs of NOR gate 109a. However, these delays only become noticeable when the EXSNS signal 70 goes high.

When the EXSNS signal 70 is high, output of the NOR gate 109b goes high, if the other inputs of the NOR gate 109b is low. If the inputs of the NOR gate 109b are low, inputs to the NOR gate 109a is also low, due to the similarity in the components and interconnection of components coupled to the NOR gate 109a. With the inputs of the NOR gate 109a low, output of the NOR gate 109a goes high. With both outputs of the NOR gates 109a,b which are also inputs of a NOR gate 111, going high, the SNS signal 63 also goes high.

Similarly, when the EXSNS signal 70 goes low, output of the NOR gate 109b goes low. The inputs to the NOR gate 109a is also low and thus the output of the NOR gate 109a goes high. With both outputs of the NOR gates 109a,b which are also inputs of a NOR gate 111, low, the SNS signal 63 also goes low.

In FIG. 10, timing diagrams of the EXSNS signal, the TRG signal, the $A_0$ signal, the ATD signal, the SNS signal, and the internal and external clock signals illustrate the interaction of these signals and the operation of the data timing control circuit 15. Since, the internal clock signal provides the input to the address sequencer, the $A_0$ signal depends on the state of the INTCLK signal. Therefore, the $A_0$ signal switches, i.e changes state, upon every rising edge of the INTCLK signal. The ATD signal from the ATD circuit 9, depending on the state of the $A_0$ signal, is generated at the falling edge of the $A_0$ signal. The ATD signal marks the start of the transition from one address to another. The SNS signal 63 acts to control the sense amplifiers such that during the periods TS1 and TS2, the sense amplifiers are triggered to read the memory cells at the rising edge of the SNS signal. As described in reference with FIG. 8, the time duration of the periods TS1 and TS2 are controlled by the resistors 107a and the capacitors 107b,c. Therefore, if more time is required for data sensing, additional capacitance is added to extend the time duration of the periods TS1 and TS2.

The sense amplifiers are triggered to stop reading the memory cells at the falling edge of the SNS signal. It is assumed that for a standard read operation, the sense amplifiers are allowed two external clock cycles to read the memory cell. In FIG. 10, when the TRG signal is high, at the rising edge of the external clock signal, the next internal clock cycle is skipped. As illustrated earlier in reference to FIG. 7, when the TRG signal is high, a boundary crossing is encountered. When a boundary crossing is encountered, the sense amplifiers needs additional time to read the data. Since the INTCLK signal is supplied to the address sequencer to control the incrementing of the addresses, the $A_0$ signal does not change until the rising edge of the INTCLK signal. If the $A_0$ signal does not change then the ATD signal is not generated. If the ATD signal is not generated and the $A_0$ signal does not change, the SNS signal remains high and the sense amplifiers continue reading data from the memory cells. Therefore, by delaying the internal clock signal by an extra external clock cycle, the sense amplifiers is provided additional time to perform read operations.

III. Decoder Circuits

Figure 11:
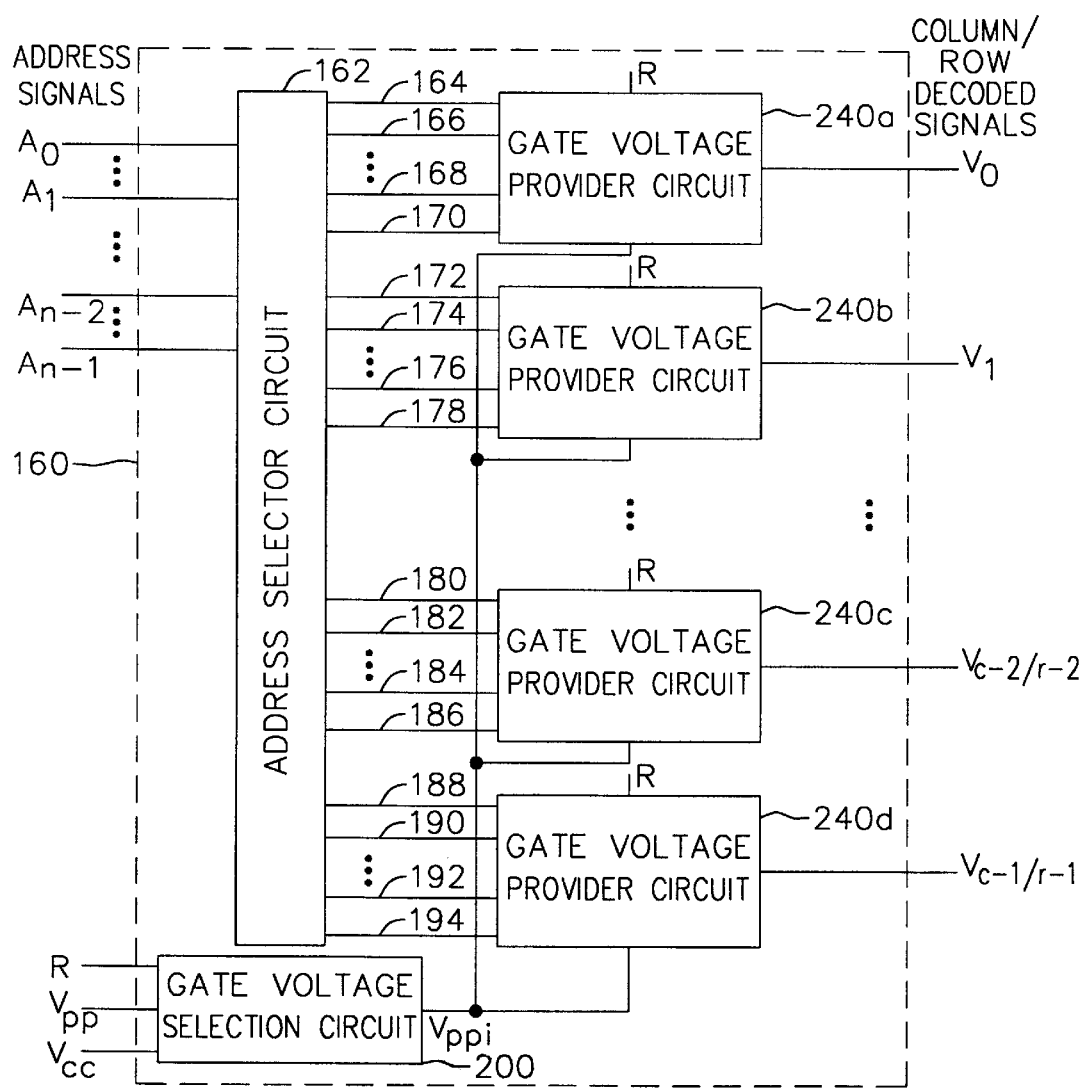
FIG. 11 is a block diagram of an address decoder circuit which is used as both a row decoder circuit and a column decoder circuit.

As illustrated earlier in reference to FIG. 1, the column and row decoders 6 and 8 generate column and row decoded signals based on the address signals generated by the address sequencer 4. One embodiment of a decoder circuit of the present invention in FIG. 11 with isolated high voltage and lower voltage portions is used as a column or a row decoder circuit 24 and 26 illustrated in FIG. 1. The address signals $A_0 \ldots A_{n-1}$ are provided as input from the row buffer 8 or the column buffer 6 as shown in FIG. 1. In FIG. 11, an address selector circuit 162 inverts zero or more of the address signals $A_0 \ldots A_{n-1}$ as needed prior to providing these signals to each of the gate voltage provider circuits 240a, 240b, 240c and 240d. When the address signals $A_0 \ldots A_{n-1}$ are indicative of a selection of a particular gate voltage provider circuit, zero or more of the address signals $A_0 \ldots A_{n-1}$ are inverted to apply logic "high" at all signal inputs for that particular gate voltage provider circuit.

For example, if the gate voltage provider circuit 240a is to be selected when all the address signals $A_0 \ldots A_{n-1}$ are logic "low", all of the signals 164, 166, 168 and 170 provided to the gate voltage provider circuit 240a are inverted at the address selector circuit 162 so that all the signals 164, 166, 168 and 170 applied at the input of the gate voltage provider circuit 240a are logic "high" when applied. For another example, if the gate voltage provider circuit 240d is to be selected when all the address signals $A_0 \ldots A_{n-1}$ are logic "high", none of the signals 188, 190, 190 and 192 provided to the gate voltage provider circuit 240d are inverted at the address selector circuit 162 so that all the signals 188, 190, 190 and 192 applied at the input of the gate voltage provider circuit 240d are logic "high" when applied.

Figure 12A:
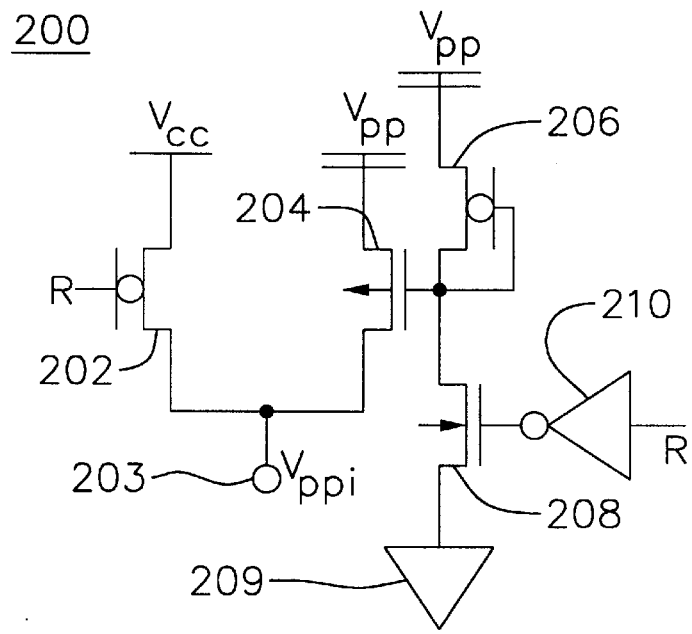
FIG. 12(A) is a gate voltage selection circuit of a conventional address decoder circuit.
Figure 12B:
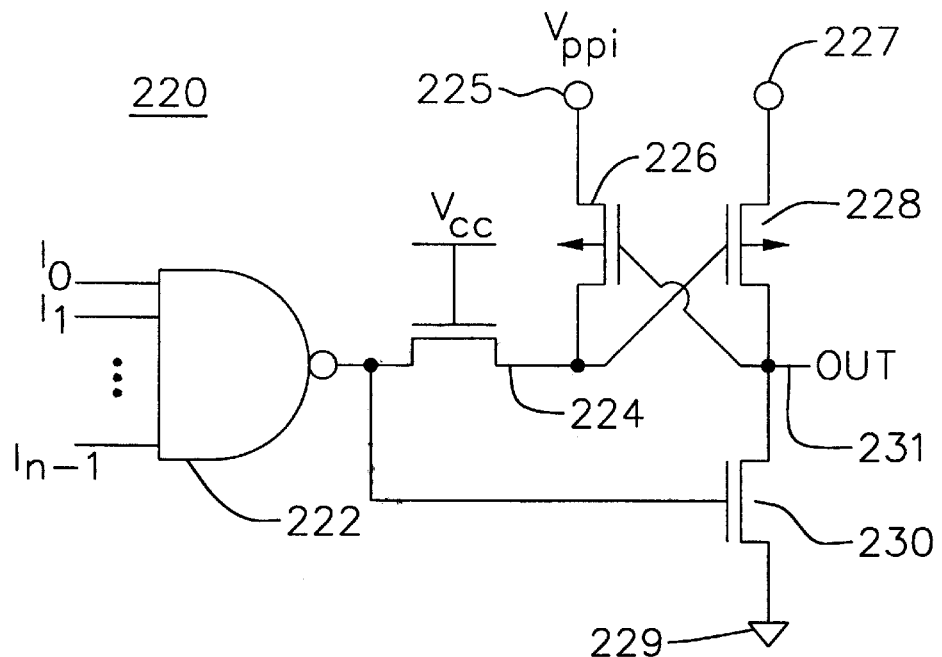
FIG. 12(B) is a one gate voltage provider circuit of a conventional address decoder circuit.

FIGS. 12(A) and 12(B) are conventional circuits used as the gate voltage selection circuit 200 and the gate voltage provider circuits 240a–240d of the address decoder circuit of FIG. 11, respectively. FIG. 12(A) shows a gate voltage selection circuit 200 which outputs a voltage output $V_{ppi}$ 203. A voltage level of the voltage output $V_{ppi}$ 203 is either $V_{cc}$ or $V_{pp}$, and depends on a read signal R. The read signal R is generated by the system using the synchronous flash memory device and provided to the synchronous flash memory device when the read operation is needed.

The read signal R is coupled to a gate of a depletion mode N-channel transistor 202. A drain of the depletion mode N-channel transistor 202 is coupled to $V_{cc}$, and a source of the depletion mode N-channel transistor 202 is coupled to the voltage output 203 $V_{ppi}$. The read signal R is also coupled to an input of an inverter 210. An output of the inverter 210 is coupled to a gate of a P-channel transistor 208. A source of the P-channel transistor 208 is coupled to a common 209. A drain of the P-channel transistor 208 is coupled to a gate of an enhanced mode N-channel transistor 204. A drain of the enhanced mode N-channel transistor 204 is coupled to $V_{pp}$.

A drain of the P-channel transistor 208 is also coupled to a source and a gate of a depletion mode N-channel transistor 206. The gate of the enhanced mode N-channel transistor 204 is coupled to the drain of the P-channel transistor 208. The enhanced mode N-channel transistor 204 is a high voltage transistor having thick oxide layer and low conductivity since it needs to handle the high gate program voltage $V_{pp}$.

The read signal R goes high during the read operation. When the read signal R is high, the N-channel transistor 202 turns on and a voltage at the source of the transistor 202 becomes close to $V_{cc}$. Therefore, the voltage output $V_{ppi}$ 203 becomes close to $V_{cc}$. When the read signal R is high, the output of the inverter 210 becomes low. When the output of the inverter 210 goes low, the P-channel transistor turns on, supplying a near ground potential to the gate and the source of the enhanced mode N-channel transistor 206. The near ground potential is also applied at the gate of the depletion mode N-channel transistor 204, turning it off, thus preventing it from providing $V_{pp}$ to the voltage output $V_{ppi}$ 203.

When the read signal R goes low during the program operation, the depletion mode N-channel transistor 202 is turned off, thus preventing it from providing $V_{cc}$ to the voltage output $V_{ppi}$ 203. When the read signal R is low, the output of the inverter 210 goes high, thus turning off the P-channel transistor 208. The enhanced mode N-channel transistor 204 is turned on, and the program drain voltage $V_{pp}$ is provided to the voltage output $V_{ppi}$ 203.

Both column decoder circuit 24 and the row decoder circuit 26 comprise a plurality of the gate voltage provider circuits 220 of FIG. 12(B), one per output, because each gate voltage provider circuit provides necessary voltage to a specific column control transistor or a specific row of memory cells.

In the gate voltage provider circuit 220, the signals from the address selector circuit 162 are inputted into a NAND gate 222 as input signals. An output of the NAND gate 222 is coupled to a drain of an N-channel transistor 224 and a gate of an N-channel transistor 230. A gate of the N-channel transistor 224 is coupled to $V_{cc}$. A source of the N-channel transistor 224 is coupled to a source of a P-channel transistor 226 and a gate of a P-channel transistor 228.

Drains of the P-channel transistors 226 and 228 are coupled to $V_{ppi}$ input terminals 225 and 227, respectively. The $V_{ppi}$ input is provided by the gate voltage selection circuit 200. A gate of the P-channel transistor 226, a source of the P-channel transistor 228 and a drain of the N-channel transistor 230 are coupled to an output voltage 231 of the gate voltage provider circuit 220. A source of the N-channel transistor 230 is coupled to a common 229.

When a specific gate voltage provider circuit 220 is not selected, at least one of the input signals $I_0 \ldots I_{n-1}$ to the NAND gate 222 is logic "low". When at least one input to the NAND gate 222 is logic "low", the output of the NAND gate 222 is logic "high". When the output of the NAND gate 222 is logic "high", the N-channel transistor 230 turns on, pulling the output voltage 231 down to nearly ground of the common 229. When the output voltage 231 is pulled low, the P-channel transistor 226 turns on, providing a logic "high" voltage at the gate of the P-channel transistor 228, thus preventing it from providing a high voltage at the output 231. Therefore, the gate voltage provider circuit 220 does not provide an output voltage for read or program operation when it is not selected.

When a specific gate voltage provider circuit 220 is selected, all of the input signals $I_0 \ldots I_{n-1}$ are logic "high", and the output of the NAND gate 222 is logic "low". The low logic applied at the gate of the N-channel transistor 230 turns it off, so that the output 231 is not pulled low. The logic "low" from the output of the NAND gate 222 is applied at the gate of the P-channel transistor 228 through the N-channel transistor 224. The N-channel transistor 228 turns on and pulls the output 231 high to $V_{pp}$ or $V_{cc}$, depending on a voltage level of the $V_{ppi}$ 227.

Since the transistors 226, 228 and 230 must handle $V_{pp}$, they are high voltage transistors with a thick oxide layer and a relatively low conductivity. When $V_{cc}$ is lower than typical, a conductivity of the P-channel transistor 228 becomes really low, and this results in a slow read operation. As a result, the transistor 202 which provides $V_{cc}$ to the $V_{ppi}$ 203 must be large.

Figure 13:
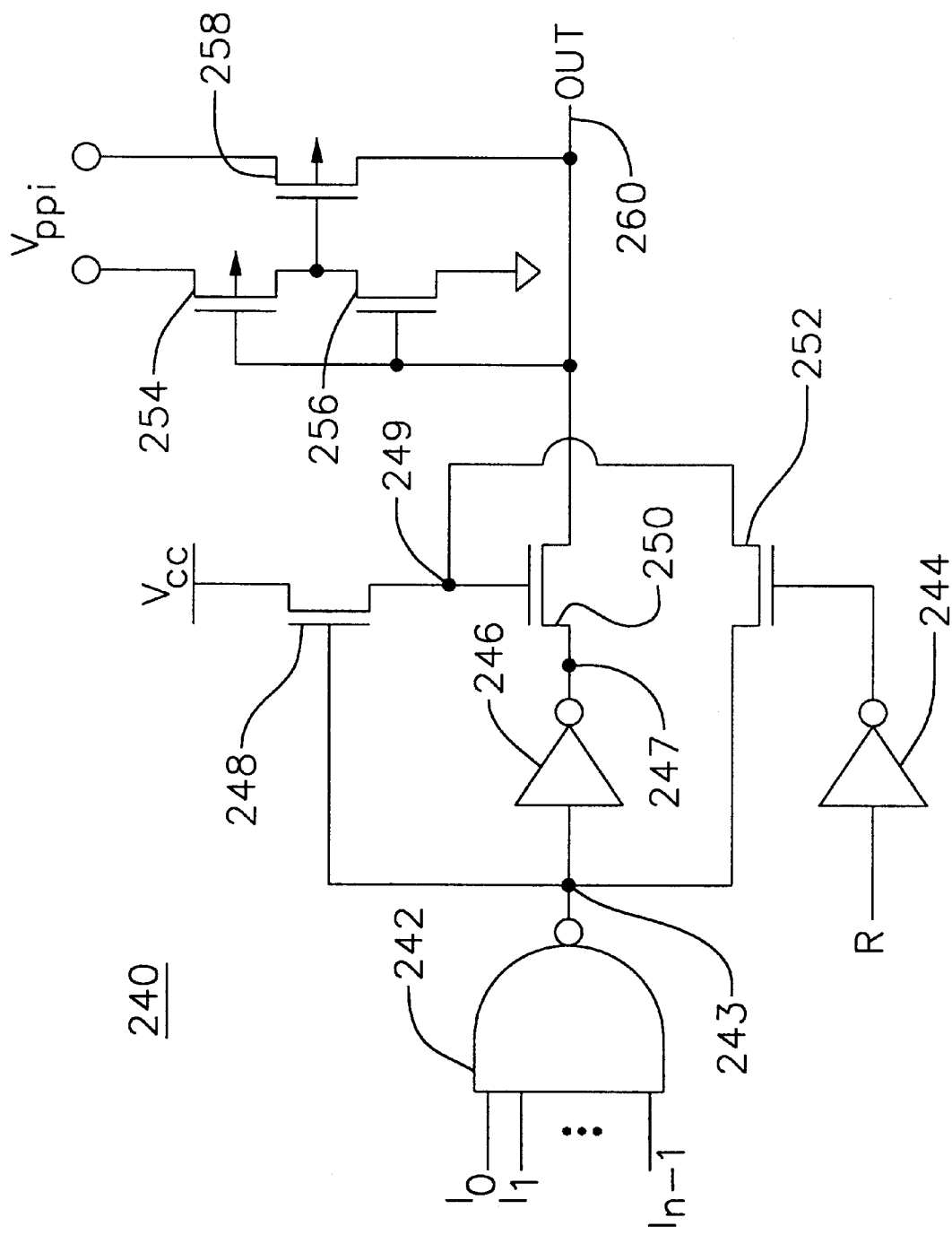
FIG. 13 is a one gate voltage provider circuit of the present invention.

In FIG. 13, one embodiment of a gate voltage provider circuit 240 of the present invention is illustrated having a separate high voltage portion and a separate lower voltage portion. The lower voltage portion of the gate voltage provider circuit performs the operations requiring fast switching. In the gate voltage provider circuit 240, a NAND gate 242, when the gate voltage provider circuit 240 is selected, receives the input signals in an identical manner as the NAND gate 222 of the conventional circuit.

An output 243 of the NAND gate 242 is coupled to a gate of an N-channel transistor 248, an input of an inverter 246, and a drain of an N-channel transistor 252. An output 247 of the inverter 246 is coupled to a drain of an N-channel transistor 250. A gate of the N-channel transistor 250 is coupled to a source of the N-channel transistor 248 and a source of the N-channel transistor 252. A source of the N-channel transistor 250 is coupled to an output voltage 260 of the gate voltage provider circuit. A read signal R is provided at an input of an inverter 244. An output of an inverter 244 is applied at a gate of the transistor 252. The transistors 248 and 250 are low voltage N-channel transistors with a threshold voltage of 0V. The N-channel transistor 250 is used to isolate the high voltage portion from the lower voltage portion.

When a specific gate voltage provider circuit is not selected, the output 243 of the NAND gate 242 is high, and therefore, the output 247 of the inverter 246 is low. The N-channel transistor 248 turns on and consequently, the N-channel transistor 250 turns on and node 249 goes high. Therefore, the low output from the inverter 246 is outputted as the output of the specific gate voltage provider circuit. When the low output of the gate voltage provider circuit is applied at the gates of the transistors 254 and 256, which operate as an inverter, the P-channel transistor 254 turns on, applying $V_{ppi}$ at the gate of the P-Channel transistor 258, and the N-channel transistor 256 turns off. As a result, the P-channel transistor 258 turns off and $V_{ppi}$ is not provided at the output 260.

When a specific gate voltage provider circuit is selected, the output 243 of the NAND gate 242 is low, and therefore, the output 247 of the inverter 246 is high. When the read signal R is high, indicating the read operation, the output of the inverter 244 is low, thus turning off the N-channel transistor 252. The output 260 is pulled high to $V_{ppi}$.

Because of channel capacitance of the N-channel transistor 250, the node 249 of the gate of the N-channel transistor 250 is coupled high, keeping high conductivity of the N-channel transistor 250. Since the inverter 246 is formed with high conductivity transistors, the output 260 is driven strongly, and thus results in a fast operation for read. In addition, the inverter 246 by producing a high output does not cause the $V_{ppi}$ voltage to drop. Therefore, the depletion mode N-channel transistor 202 of the gate voltage selection circuit in FIG. 12a does not have to be large to compensate for any voltage drop in $V_{ppi}$.

When a specific gate voltage provider circuit is selected and when the read signal R is low, indicating a program operation, the output of the inverter 244 is high, thus turning on the N-channel transistor 252. The N-channel transistor 248 gradually turns off as node 249 is pulled low. As described above in reference with the read operation, the output 260 is pulled high to $V_{ppi}$. However, the N-channel transistor 248, by turning off acts as a buffer to isolate the low voltage portion of the gate voltage provider circuit from the high voltage portion of the gate voltage provider circuit. Therefore, program voltage, i.e. high voltage as compared to a read voltage, is provided at the output 260 without effecting the low voltage portion of the gate voltage provider circuit.

IV. Address Sequencer

The address sequencer sequentially increments addresses by one, synchronous with the rising edge of the internal clock signal. For generation of the address signals, toggle signals are used. These toggle signals are generated internally to the address sequencer.

Conventionally, generating n address signals using toggle signals made use of multiple logic gates configured together. This conventional configuration of logic gates, illustrated in FIG. 11, imposed a series of delays through n−1 NAND gates and n−1 inverters for each set of address signals. The sum of these delays presents a significant delay, especially in view of the increasing operating clock frequency of memory devices. For example, if a delay of $t_1$ is associated with each logic gate, the total amount of delay $J=n \times t_1$. This prevents the clock period from becoming less than J. Therefore, reducing the number of gates in the delay path of the logic gates, i.e. address signal generators, in the address sequencer provides the capability of a memory device to operate with higher frequency clocks.

Figure 14:
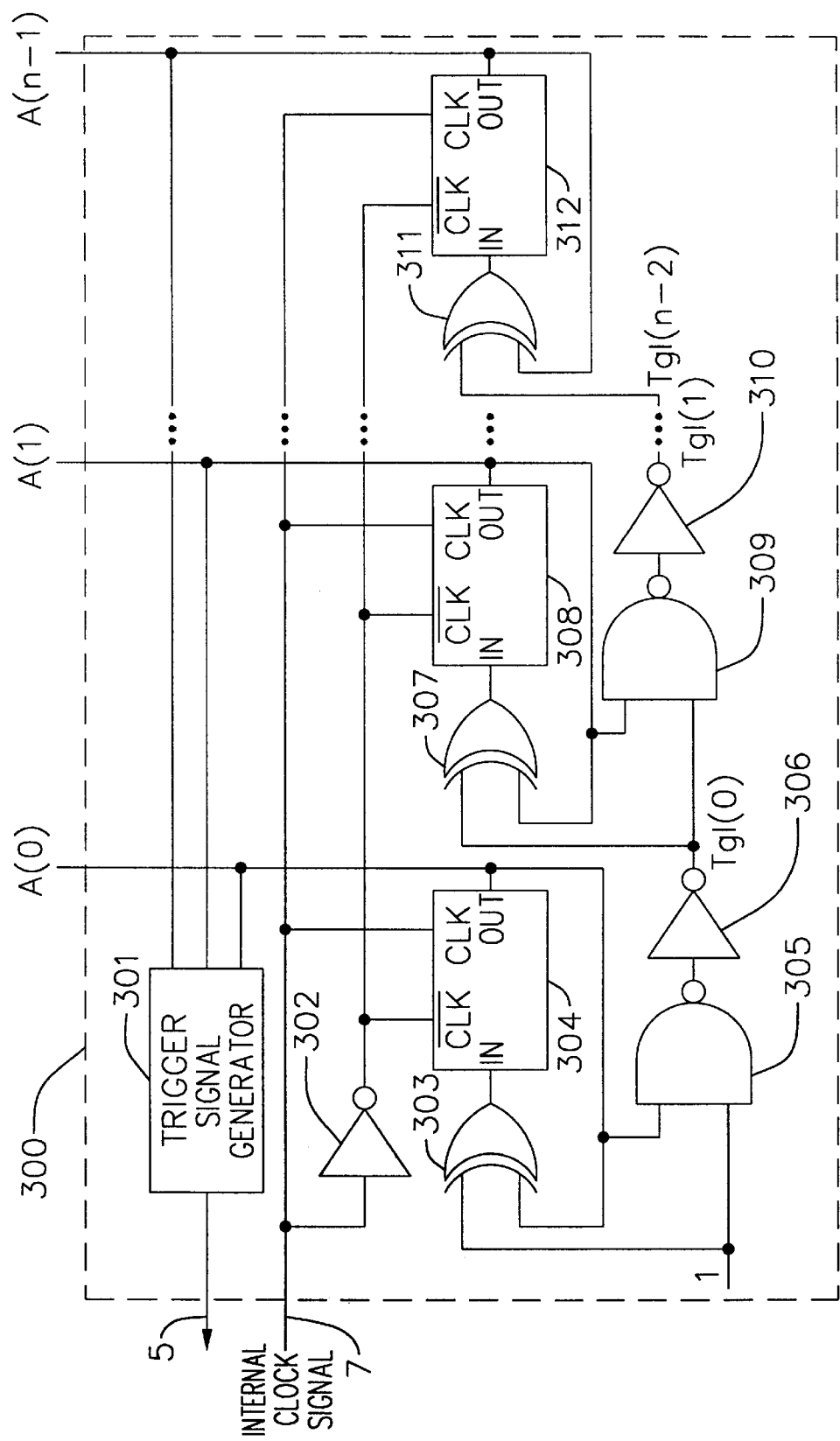
FIG. 14 is a conventional address sequencer.

FIG. 14 is a block diagram of a conventional address sequencer 300. A trigger signal generator 301 generates the trigger signal 5 which is provided to the clock control circuit 2 for initiating the inhibiting of clock cycles in the internal clock signal as previously described in reference to FIGS. 2–7. This is just one instance where the trigger signal 5 is generated, and the generation of the trigger signal 5 is, by no means, limited to this one particular instance. The clock trigger signal generator 301 is coupled to the address signals internally generated by the address sequencer 300.

The address sequencer 300 comprises address signal generators 304, 308 and 312, which generates address signals of $A_0$, $A_1$ and $A_{n-1}$, respectively. For clarity, the address signal generators for the address signals $A_2 \ldots A_{n-2}$ are not shown in FIG. 11. Each address signal generator is coupled to the internal clock signal 7 and an inverse internal clock signal. The internal clock signal input 7 is inverted by an inverter 302 to generate the inverse internal clock signal. The address signal generators 304, 308 and 312 are also coupled to outputs of two-input XOR gates 303, 307 and 311, respectively.

A first input of the XOR gate 303 is coupled to logic "1". A second input of the XOR gate 303 is coupled to an output $A_0$ of the address signal generator 304. The first input of the XOR gate 303 is also coupled to a first input of a NAND gate 305. The second input of the XOR gate 303 is also coupled to a second input of a NAND gate 305. An output of the NAND gate 305 is coupled to an input of an inverter 306.

An output toggle signal (Tgl(0)) of the inverter 306 is coupled to a first input of the XOR gate 307 and a first input of a NAND gate 309. An output $A_1$ of the second address generator 308 is coupled to a second input of the XOR gate 307 and a second input of a NAND gate 309. An output of the NAND gate 309 is coupled to an input of an inverter 310. An output of the inverter 310 is a toggle signal (Tgl(1)). A first input of the XOR gate 311 is coupled to a toggle signal (Tgl(n−2)). A second input of the XOR gate 311 is coupled to an output $A_{n-1}$ of the address signal generator 312.

The configuration of one of the address signal generators 304, 308 or 312, one of the two-input XOR gates 303, 307 or 311, one of the NAND gates 305 or 309, and one of the inverters 306 or 310, illustrated in FIG. 14, are represented by the following Boolean equations:

$$A_{(n)}(T)=Tgl_{(n-1)}(T-1)\oplus A_{(n)}(T-1); \quad \quad 1)$$

where a) $Tgl_{(n)}(T-1)=Tgl_{(n-1)}(T-1) \cdot A_n(T-1)$; and
b) $Tgl(-1)=1$.

With the logic equation of $\overline{A \cdot B}=\overline{A}+\overline{B}$ and conventional Boolean Algebra, the following Boolean equations are developed. For even addresses, i.e. where n is even, the following resulting Boolean equations are:

$$A_{(n)}(T)=Tgl_{(n-1)}(T-1)\oplus A_{(n)}(T-1); \quad \quad 2)$$

and a) $Tgl_{(n)}(T-1)=Tgl_{(n-1)}(T-1) \cdot A_{(n)}(T-1)$.

For odd addresses, i.e. where n is odd, the following resulting Boolean equations are:

$$A_{(n)}(T)=Tgl_{(n-1)}(T-1)\oplus A_{(n)}(T-1); \quad \quad 3)$$

and a) $Tgl_{(n)}(T-1)=Tgl_{(n-1)}(T-1)+A_{(n)}(T-1)$.

Figure 15A:
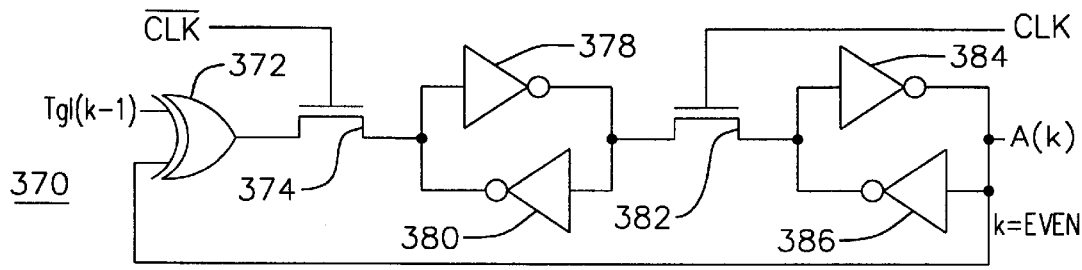
FIG. 15(a) is one embodiment of improved address signal generators of the present invention for even address signals.
Figure 15B:
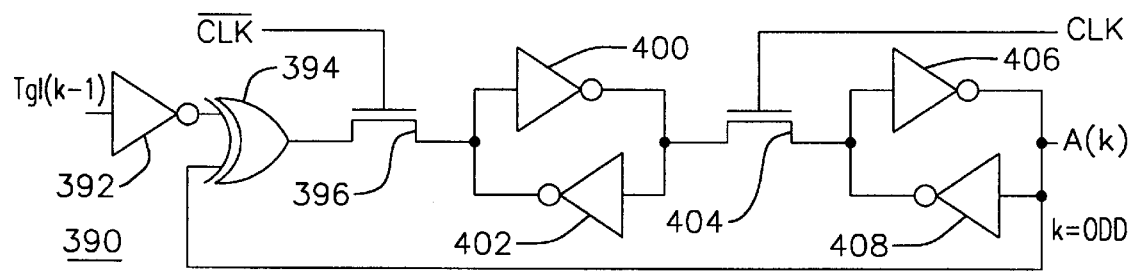
FIG. 15(b) is one embodiment of improved address signal generators of the present invention for odd address signals.
Figure 15C:
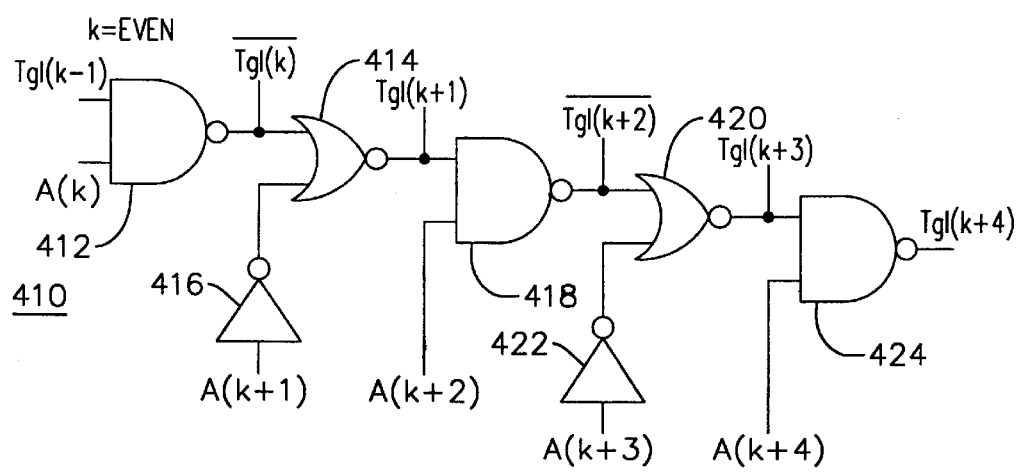
FIG. 15(c) is a signal delay path for generation of address signals using an address signal generator of the present invention.

The Boolean equation (2) and (3) are represented by the logic gates illustrated in FIGS. 15(a)–(c).

With the NOR gate delay equaling the delay of a NAND gate, then the minimum cycle time limited by address sequencer is reduced. Therefore, the delay is decreased. For example, if the delay of a NOR or a NAND gate is $T_{an}$, the total delay is $J=20 \times T_{an}$. Conventionally, the delay is the combination of the NAND gate and the inverter. Therefore, the total delay is longer. For instance the total day is about 20. Hence, an improvement of $n \times T_{ai}$ in cycle time is realized. If $T_{ai}$ is 0.5 ns, then 10 ns are reduced.

Similarly, in another embodiment of the address sequencer, the Boolean equations (1) and (1a) are manipulated by setting m=½. With m=½ and using conventional Boolean Algebra, the following Boolean equations are developed:

$$A_{(2m)}(T)=Tgl_{(2m-1)}(T-1)\oplus A_{(2m)}(T-1); \quad \quad (4)$$

and $$Tgl_{(2m-1)}(T-1)=Tgl_{(2m-2)}(T-1) \cdot A_{(2m-1)}(T-1). \quad \quad (5)$$

By combining equation (5) with equation (4), the following Boolean equation is:

$$A_{(2m)}(T)=Tgl_{(2(m-1))}(T-1) \cdot A_{(2m-1)}(T-1) \oplus A_{(2m)}(T-1). \quad \quad (6)$$

Therefore, using equation (1), the resulting Boolean equations are:

$$A_{(2m-1)}(T)=Tgl_{(2(m-1))}(T-1) \oplus A_{(2m-1)}(T-1) \quad \quad (7)$$

$$\begin{aligned}Tgl_{(2m)}(T-1) &= Tgl_{(2m-1)}(T-1) \cdot A_{(2m)}(T-1) \\ &= Tgl_{(2(m-1))}(T-1) \cdot A_{(2m-1)}(T-1) \cdot A_{(2m)}(T-1).\end{aligned} \quad (8)$$

Figure 16A:
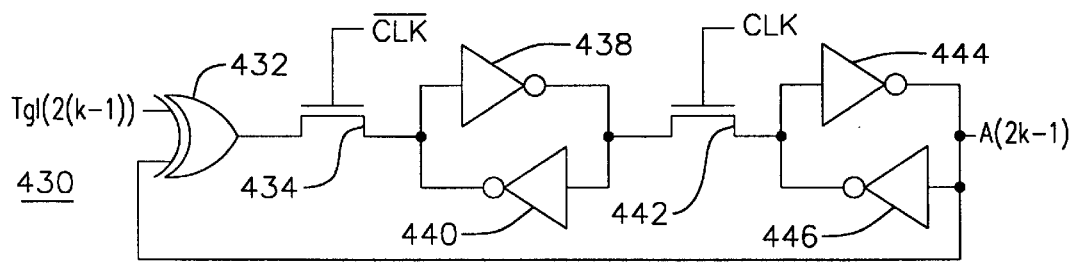
FIG. 16(a) is one embodiment of address signal generators of the present invention for odd address signals.
Figure 16B:
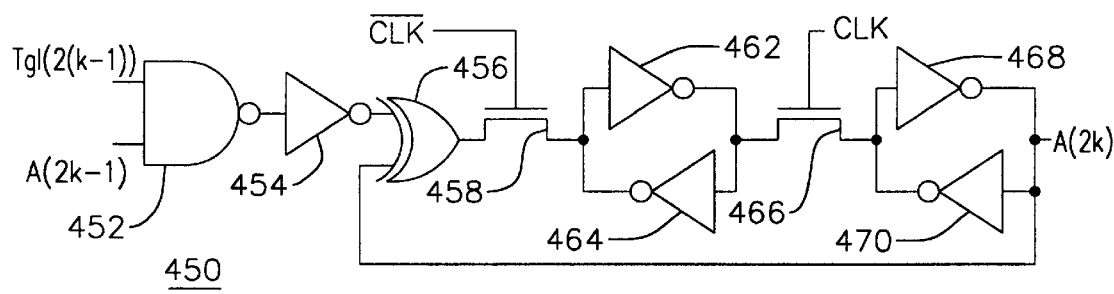
FIG. 16(b) is one embodiment of address signal generators of the present invention for even address signals.
Figure 16C:
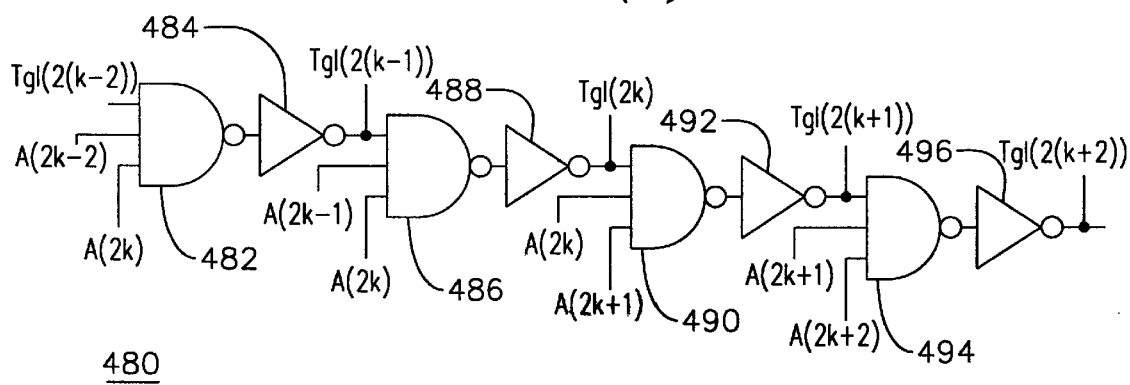
FIG. 16(c) is a signal delay path for generation of address signals using an address signal generator of the present invention.

The Boolean equations (6), (7) and (8) are represented by the logic gates illustrated in FIGS. 16(a)–(c) with k=n/2. As illustrated in FIGS. 16(a)–(c), the total number of NAND gates is n/2 and therefore the cycle time limiting the address sequencer is reduced in half.

Figure 17:
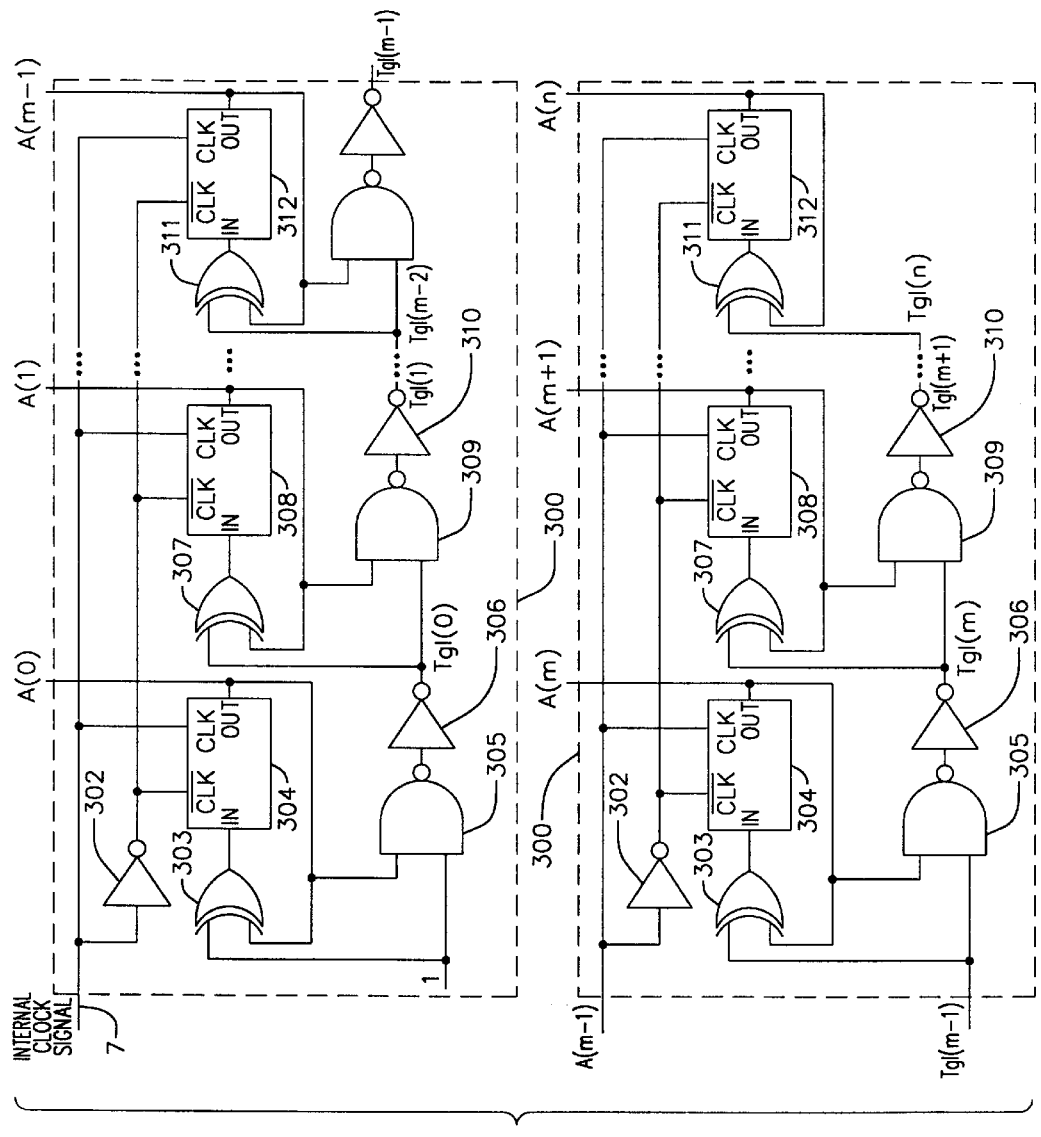
FIG. 17 is a block diagram of one embodiment of an address sequencer of the present invention.

Another embodiment of the address sequencer is illustrated in FIG. 17. The address sequencer in FIG. 17 is similar to the conventional address sequencers illustrated in FIG. 11. However, in FIG. 17, the clock inputs to some of the address sequencers are address bits. The address bit from the address buffer for the last column control transistor that marks the transition (beginning/end) of a word line is used. The inverse of the last column address bit is also used in place of the clock inputs to the address sequencers.

For example, for addresses containing address signals A0 to A21, twenty two address buffers are used. Address buffers for address bits A0 to A5 uses the internal clock signal. A5 is assumed to be the word line switch address bit. However, any address signal can be used, although the wordline switch address bit allows the largest delay time due to the wordline switch. A5 is used as the clock signal, suppling the clock input to the rest of the address buffers used to produce address A6 to A21.

V. Data Sensing

Referring back to FIG. 1, the sense amplifiers 18 and 22 are coupled to individual data lines. These data lines are coupled to the bit lines of the individual memory blocks. The initial voltage level of these data lines are usually zero. However, often a data line has a higher voltage level than ground level due to capacitance developed between adjacent data lines. Therefore, as the predetermined read voltages are applied to the data lines and S/A 18 and 22 attempt to sense the data from the memory cells, a delay is experienced. Traditionally, the data lines are separated, i.e. providing a large space between the data lines to remove the delay. However, by adding a large spacing between data line, the memory die size, the physical space occupied by the flash memory device is also increased.

Figure 18:
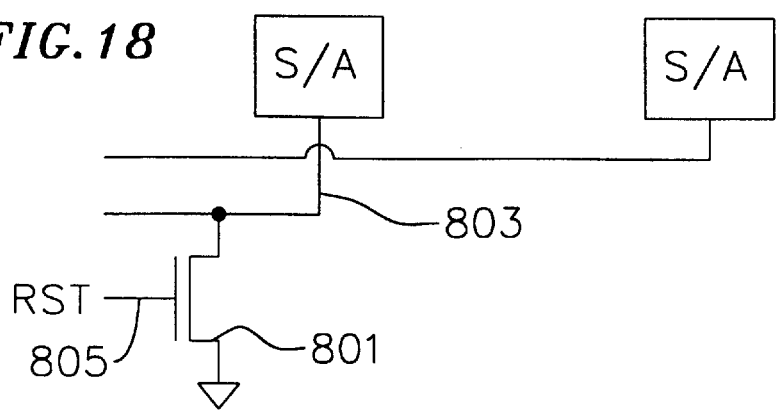
FIG. 18 is a block diagram for one embodiment of a data sensing scheme.

To remove the delay without increasing the memory die size, a pull down transistor is introduced to the data line. In FIG. 18, the pull down transistor 801 is coupled to the data line 803. The gate of the pull down transistor 801 is coupled to a reset signal line 805. Prior to the reading of a memory cell, the reset signal line 805 goes high for a short period of time. Therefore, the pull down transistor turns on and grounds the data line. With all the data lines initially starting at a ground voltage level, the capacitance coupling between data lines are reduced as well as the capacitance on the individual data lines. Therefore, the delays experienced by the data lines are reduced without increasing the memory die size.

VI. High Voltage Comparator

Figure 19:
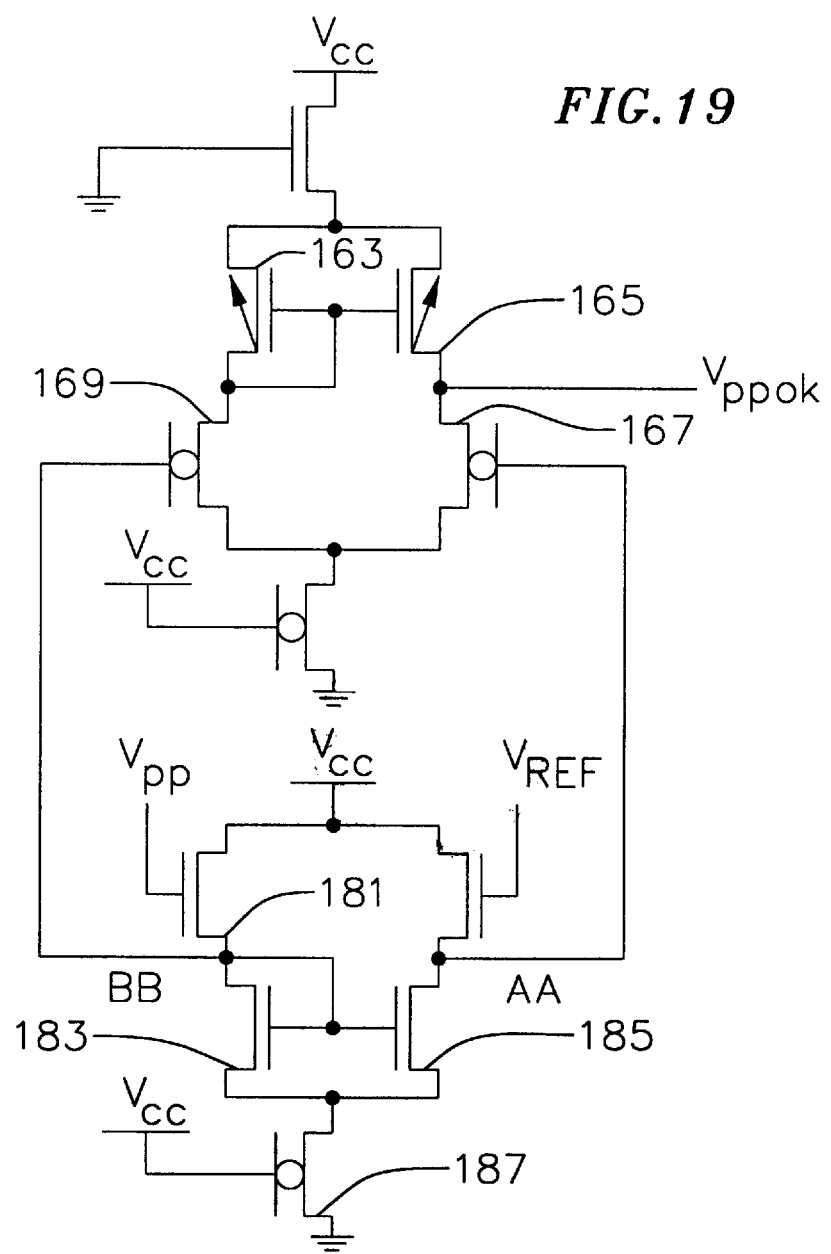
FIG. 19 is a schematic of one embodiment of a high voltage comparator.

As illustrated in reference to FIG. 1, a program operation requires a set of predetermined voltages to be applied to the memory cells. The high voltage comparator circuit 54 of FIG. 1 comprises a set of transistors to determine the precise timing when the predetermined voltages are sufficiently high enough to start programming the memory cell. FIG. 19 illustrates one embodiment of the high voltage comparator circuit 54 of FIG. 1. The high voltage comparator circuit, in FIG. 19, detects the moment when the voltage levels, predetermined program voltages, at line AA corresponds to the voltage level at line BB. Voltage level at line $V_{ref}$ is assumed to be constantly high and the voltage level at line $V_{pp}$ is assumed to be increasing. The line $V_{pp}$ is coupled to a gate of a $V_{pp}$ transistor 181. As the voltage level at line $V_{pp}$ increases, the $V_{pp}$ transistor 181 turns on and causes the line BB, coupled to a drain of the $V_{pp}$ transistor 181, to be slowly pulled to $V_{cc}$. Therefore, as the voltage level at line $V_{pp}$ is increasing, the voltage level at line BB also gradually increases.

The line BB is also coupled to gates of a BB transistor 183 and a AA transistor 185. Hence, as the voltage level at line BB gradually increases, the BB and AA transistors gradually turn on. Coupled to a source of the AA transistor 185 is a line AA which is also coupled to a drain of a reference transistor 187. The line $V_{ref}$ is coupled to a gate of the reference transistor 187. Since the reference transistor 187 is on, due to the constant voltage level being applied at line $V_{ref}$, the voltage level at line AA is close to the voltage $V_{cc}$. As the AA transistor gradually turns on, a path to ground is developed from voltage $V_{cc}$ and thus the voltage level at line AA is gradually pulled down. Therefore, the voltage level at line AA gradually decreases as the voltage level at line BB gradually increases.

Line AA is also coupled to a gate of a AA depletion mode transistor 167 and line BB is coupled to a gate of a BB depletion mode transistor 169. As the voltage level at line BB is gradually increasing, the BB depletion mode transistor 167 is gradually turning on. Similarly, as the voltage level at line AA is gradually decreasing, the AA depletion mode transistor transistor 167 is gradually turning off. A source of the BB depletion mode transistor 169 is coupled to commonly coupled gates of a first p-channel transistor 163 and a second p-channel transistor 165. Once the BB depletion mode transistor 169 turns on, a path to ground is formed causing the first p-channel transistor 163 and the second p-channel transistor 165 to turn on.

A line $V_{PPOK}$ is coupled to a source of the AA depletion mode transistor 167 and a drain of the second p-channel transistor 165. As the second p-channel transistor turns on and the AA depletion mode transistor 167 is slowly turning off, the line $V_{PPOK}$ is provided a path to the voltage $V_{cc}$. Therefore, the line $V_{PPOK}$ sharply increases. In other words, as voltage level at line BB increases and corresponds to the voltage level at line AA in which the voltage level at line AA is decreasing, the voltage level at line $V_{PPOK}$ increases. Therefore, as soon as the voltage level at line BB is larger than the voltage level at line AA, the voltage level at line $V_{PPOK}$ sharply increases as the line $V_{PPOK}$ is pulled to voltage $V_{cc}$. The line $V_{PPOK}$ signifies that the voltage level at line BB is sufficiently high enough, i.e. the voltage level at line BB is larger than the voltage level at line AA, to start programming the memory cell. Therefore, the programming of the memory cells is started immediately when the predetermined program voltages, voltage level at line BB and at line AA, has achieved its specific operating voltage level.

VII. Conclusion

Accordingly, the present invention provides a decoder circuit with capability to generate quickly predetermined voltages for program and read operations. Although an application in a NOR-architecture based flash memory device is described, the decoder circuit has a broad application in any semiconductor device requiring a similar increased delivery of predetermined voltages. In particular, the decoder control circuit will be equally as useful in a NAND-architecture based synchronous flash memory devices as well.

In addition, although this invention has been described in certain specific embodiments, many additional modifications and variations would be apparent to those skilled in the art. It is therefore to be understood that this invention may be practiced otherwise than as specifically described. Thus, the present embodiments of the invention should be considered in all respects as illustrative and not restrictive, the scope of the invention to be determined by the appended claims and their equivalents rather than the foregoing description.

What is claimed is:

1. An address decoder circuit comprising:
   a gate voltage provider circuit having a high voltage portion and a low voltage portion, the high voltage portion being isolated from the low voltage portion by circuitry, the gate voltage provider circuit receives a plurality of address signals and a gate voltage; and
   a gate voltage selection circuit, the gate voltage selection circuit providing the gate voltage to the gate voltage provider circuit for use as the output of the gate voltage provider circuit;
   wherein the low voltage portion of the gate voltage provider circuit is coupled to the high voltage portion and comprises a plurality of low voltage transistors bypassing the high voltage portion of the gate voltage provider circuit.

2. An address decoder circuit comprising:
   a gate voltage provider circuit having a high voltage portion and a low voltage portion, the high voltage portion being isolated from the low voltage portion by circuitry, the gate voltage provider circuit receives a plurality of address signals and a gate voltage; and a gate voltage selection circuit, the gate voltage selection circuit providing the gate voltage to the gate voltage provider circuit for use as the output of the gate voltage provider circuit;

wherein the gate voltage provider circuit provides the gate voltage as an output when the address signals indicate conditions are met for generating the gate voltage output.

3. The address decoder circuit of claim 2, wherein the high voltage portion of the gate voltage provider circuit comprises a plurality of high voltage transistors providing a conduit for the gate voltage from the gate voltage selection circuit to the output of the gate voltage provider circuit.

4. The address decoder circuit of claim 2, wherein the low voltage portion of the gate voltage provider circuit comprises a plurality of low voltage transistors providing a conduit for the gate voltage from the gate voltage selection circuit to the output of the gate voltage provider circuit and bypassing the high voltage portion of the gate voltage provider circuit.

5. The address decoder circuit of claim 4, wherein the low voltage portion of the gate voltage provider circuit comprises:

a second low voltage transistor coupled to the output of the gate voltage provider circuit and the high voltage portion of the gate voltage provider circuit;

a first low voltage transistor coupled to a reference voltage and the second low voltage transistor, the first low voltage transistor acting as a switch to turn on the second low voltage transistor;

a NAND gate coupled to the address signals;

a first inverter receiving a read signal;

a second inverter coupled to the NAND gate and the first and second low voltage transistors; and a third low voltage transistor coupled to the first and second inverters, the NAND gate and the second low voltage transistor.

6. The address decoder circuit of claim 3, wherein the high voltage portion of the gate voltage provider circuit comprises:

a common ground;

a first high voltage transistor coupled to the output of the gate voltage provider circuit, the low voltage portion of the gate voltage provider circuit and to the common ground;

a second voltage transistor coupled to the output of the gate voltage selection circuit, the first high voltage transistor and the output of the gate voltage provider circuit; and a third voltage transistor coupled to the output of the gate voltage selection circuit, the first and second high voltage transistor and the output of the gate voltage provider circuit.

7. An address decoder circuit comprising:

a gate voltage provider circuit having a high voltage portion, a low voltage portion, the gate voltage provider circuit receives a plurality of address signals and a gate voltage; and a gate voltage selection circuit, the gate voltage selection circuit providing the gate voltage to the gate voltage provider circuit for use as the output of the gate voltage provider circuit;

wherein the low voltage portion of the gate voltage provider circuit comprises:

a N-channel transistor being coupled to the output of the gate voltage provider circuit and the high voltage portion of the gate voltage provider circuit;

a first low voltage transistor coupled to a reference voltage and the N-channel transistor, such that the first low voltage transistor switches the N-channel transistor on.

\* \* \* \* \*